(12) United States Patent
Lee et al.

(10) Patent No.: US 11,769,712 B2
(45) Date of Patent: Sep. 26, 2023

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Hsiao-Yen Lee, Kaohsiung (TW); Hung-Yi Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 193 days.

(21) Appl. No.: 17/334,564

(22) Filed: May 28, 2021

(65) Prior Publication Data

US 2022/0384308 A1 Dec. 1, 2022

(51) Int. Cl.
| | |
|---|---|
| H01L 23/48 | (2006.01) |
| H01L 23/498 | (2006.01) |
| H01L 23/538 | (2006.01) |
| H01L 23/522 | (2006.01) |
| H01L 23/00 | (2006.01) |
| H01L 25/10 | (2006.01) |
| H01L 21/56 | (2006.01) |
| H01L 21/48 | (2006.01) |

(52) U.S. Cl.
CPC ........ *H01L 23/481* (2013.01); *H01L 21/4857* (2013.01); *H01L 21/56* (2013.01); *H01L 23/49816* (2013.01); *H01L 23/49822* (2013.01); *H01L 23/49833* (2013.01); *H01L 23/49838* (2013.01); *H01L 23/5223* (2013.01); *H01L 23/5385* (2013.01); *H01L 23/5386* (2013.01); *H01L 24/16* (2013.01); *H01L 25/105* (2013.01); *H01L 2224/16227* (2013.01); *H01L 2224/16235* (2013.01); *H01L 2224/16238* (2013.01); *H01L 2225/107* (2013.01); *H01L 2225/1023* (2013.01); *H01L 2225/1041* (2013.01); *H01L 2225/1058* (2013.01); *H01L 2924/182* (2013.01)

(58) Field of Classification Search
CPC ... H01L 23/481; H01L 21/4857; H01L 21/56; H01L 23/49822; H01L 23/5223; H01L 23/5385
See application file for complete search history.

(56) References Cited

U.S. PATENT DOCUMENTS

| | | | |
|---|---|---|---|
| 8,970,023 B2* | 3/2015 | Chou | H01L 23/3135 438/109 |
| 9,087,832 B2* | 7/2015 | Huang | H01L 23/5389 |

(Continued)

*Primary Examiner* — Nicholas J Tobergte
(74) *Attorney, Agent, or Firm* — FOLEY & LARDNER LLP

(57) ABSTRACT

A semiconductor package structure includes a first electronic component, a conductive element and a first redistribution structure. The first electronic component has a first surface and a second surface opposite to the first surface, and includes a first conductive via. The first conductive via has a first surface exposed from the first surface of the first electronic component. The conductive element is disposed adjacent to the first electronic component. The conductive element has a first surface substantially coplanar with the first surface of the first conductive via of the first electronic component. The first redistribution structure is configured to electrically connect the first conductive via of the first electronic component and the conductive element.

11 Claims, 46 Drawing Sheets

(56) References Cited

U.S. PATENT DOCUMENTS

| | | | |
|---|---|---|---|
| 9,368,438 B2* | 6/2016 | Lin | H01L 23/49816 |
| 9,761,559 B1* | 9/2017 | Shih | H01L 24/19 |
| 9,859,245 B1* | 1/2018 | Chen | H01L 24/13 |
| 10,879,220 B2* | 12/2020 | Yu | H01L 23/5383 |
| 2017/0092617 A1* | 3/2017 | Wu | H01L 24/06 |
| 2018/0102311 A1* | 4/2018 | Shih | H01L 23/49827 |
| 2019/0131273 A1* | 5/2019 | Chen | H01L 21/568 |
| 2020/0118953 A1* | 4/2020 | Yu | H01L 25/105 |
| 2020/0395335 A1 | 12/2020 | Chen et al. | |
| 2021/0057352 A1* | 2/2021 | Agarwal | H01L 21/4853 |
| 2022/0037294 A1* | 2/2022 | Hwang | H01L 21/565 |

* cited by examiner

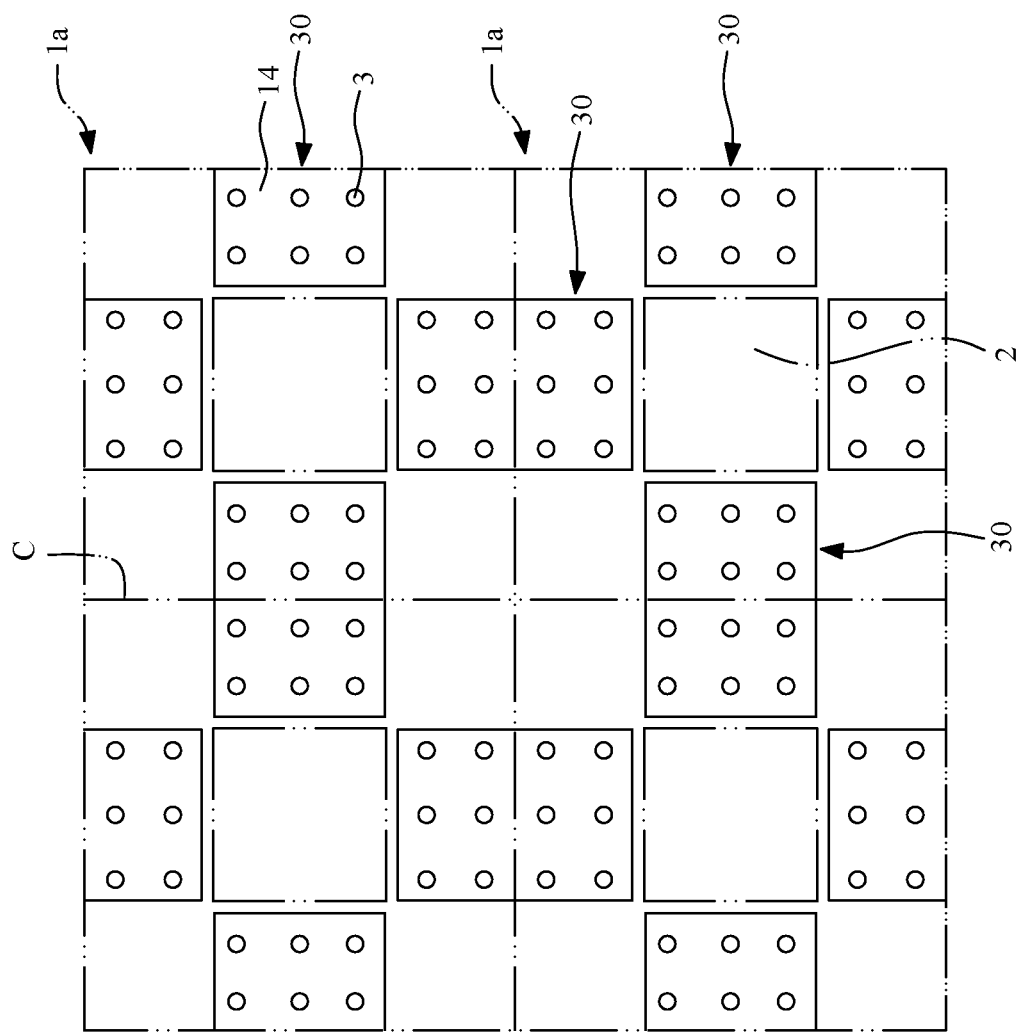

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method thereof, and to a semiconductor package structure including an electronic component having a through via, and a method for manufacturing the semiconductor package structure.

2. Description of the Related Art

In a fan-in package structure, a through silicon via may be formed through a semiconductor die for electrical connection between components disposed on two opposite surfaces of the semiconductor die. However, the fan-in package cannot meet the requirement of some products which need high input/output (I/O) count.

SUMMARY

In some embodiments, a semiconductor package structure includes a first electronic component, a conductive element and a first redistribution structure. The first electronic component has a first surface and a second surface opposite to the first surface, and includes a first conductive via. The first conductive via has a first surface exposed from the first surface of the first electronic component. The conductive element is disposed adjacent to the first electronic component. The conductive element has a first surface substantially coplanar with the first surface of the first conductive via of the first electronic component. The first redistribution structure is configured to electrically connect the first conductive via of the first electronic component and the conductive element.

In some embodiments, a semiconductor package structure includes a first electronic component, a first redistribution structure and a second redistribution structure. The first electronic component has a first surface and a second surface opposite to the first surface, and includes a first conductive via exposed from the first surface of the first electronic component. The first redistribution structure is disposed below the first surface of the first electronic component. The first redistribution structure includes a second conductive via tapering toward the first electronic component. The second redistribution structure is disposed above the second surface of the electronic component and configured to electrically connect the first redistribution structure through the first conductive via of the first electronic component, wherein the second redistribution structure comprises a third conductive via tapering toward the first electronic component.

In some embodiments, a semiconductor package structure includes a first electronic component, a first redistribution structure, a second redistribution structure and an encapsulant. The first electronic component has a first surface and a second surface opposite to the first surface, and includes a first conductive via exposed from the first surface of the first electronic component. The first redistribution structure is disposed below the first surface of the first electronic component. The second redistribution structure is disposed above the second surface of the first electronic component. The encapsulant is in contact with the first redistribution structure and the second redistribution structure, wherein a portion of the encapsulant is interposed between the first electronic component and the first redistribution structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 20A illustrates an arrangement of conductive components in the semiconductor package structure shown in FIG. 20.

DETAILED DESCRIPTION

Figure 1:
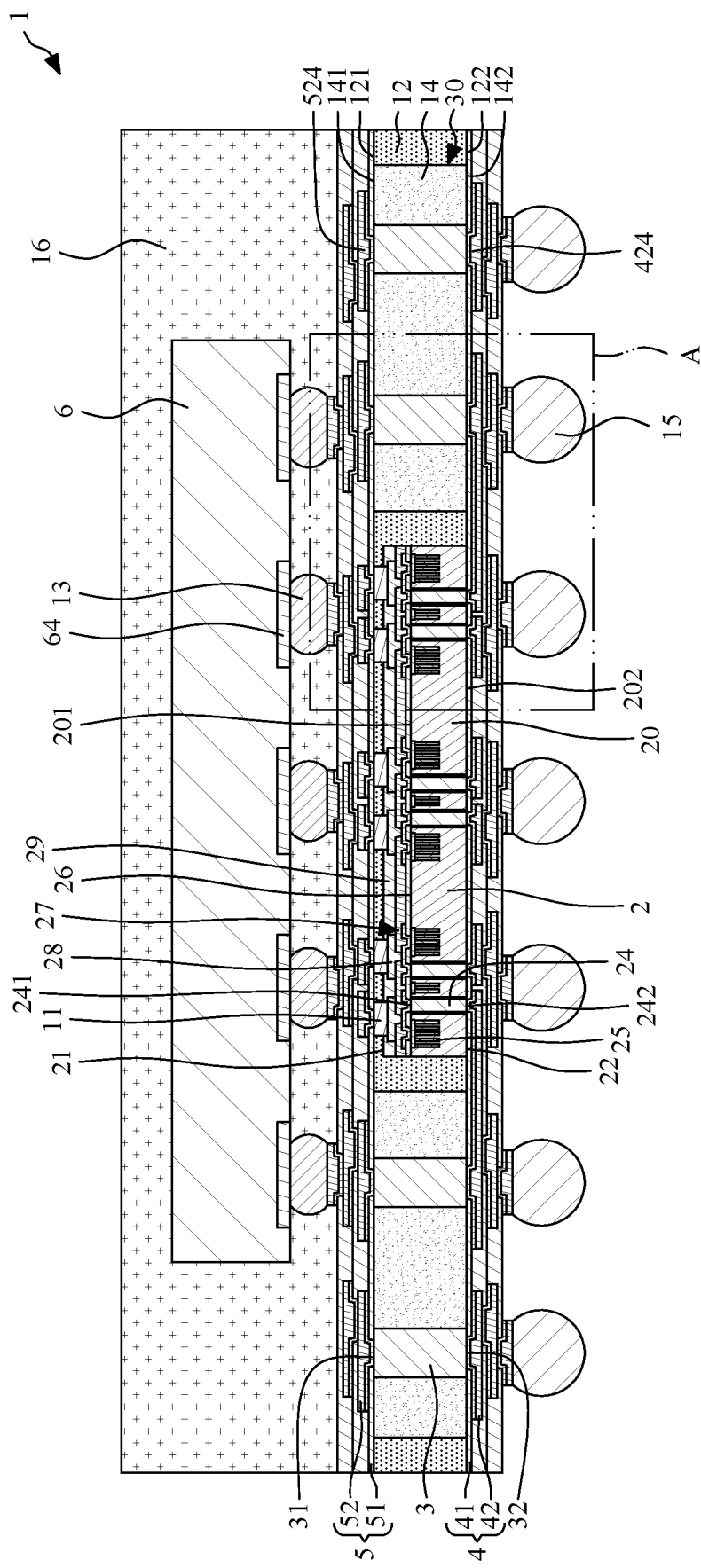
FIG. 1 illustrates a cross sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It is known that a fan-in packaging process cannot meet the requirement of some products which need high input/output (I/O) count. Hence, a fan-out packaging technique is introduced to increase the I/O count for future needs of fine pitch. Generally, a fan-out process is directly conducted on the semiconductor die. The manufacturing process is complicated, and the semiconductor die may be damaged during the process.

In another aspect, an exemplary semiconductor package structure may include a decoupling capacitor, such as a deep trench capacitor (DTC) die, and an integrated circuit (IC) die. If the DTC die is electrically connected to the IC die by a shorter electrical path, the performance of the semiconductor package structure can be better. Hence, it is required to shorten the electrical path between the DTC die and the IC die.

Hence, at least some embodiments of the present disclosure provide for a semiconductor package structure which can be manufactured through an improved fan-out process. At least some embodiments of the present disclosure provide for a semiconductor package structure in which an electrical path connecting a DTC die and an IC die is shortened. At least some embodiments of the present disclosure further provide for a process for manufacturing the aforementioned semiconductor package structure.

Figure 2:
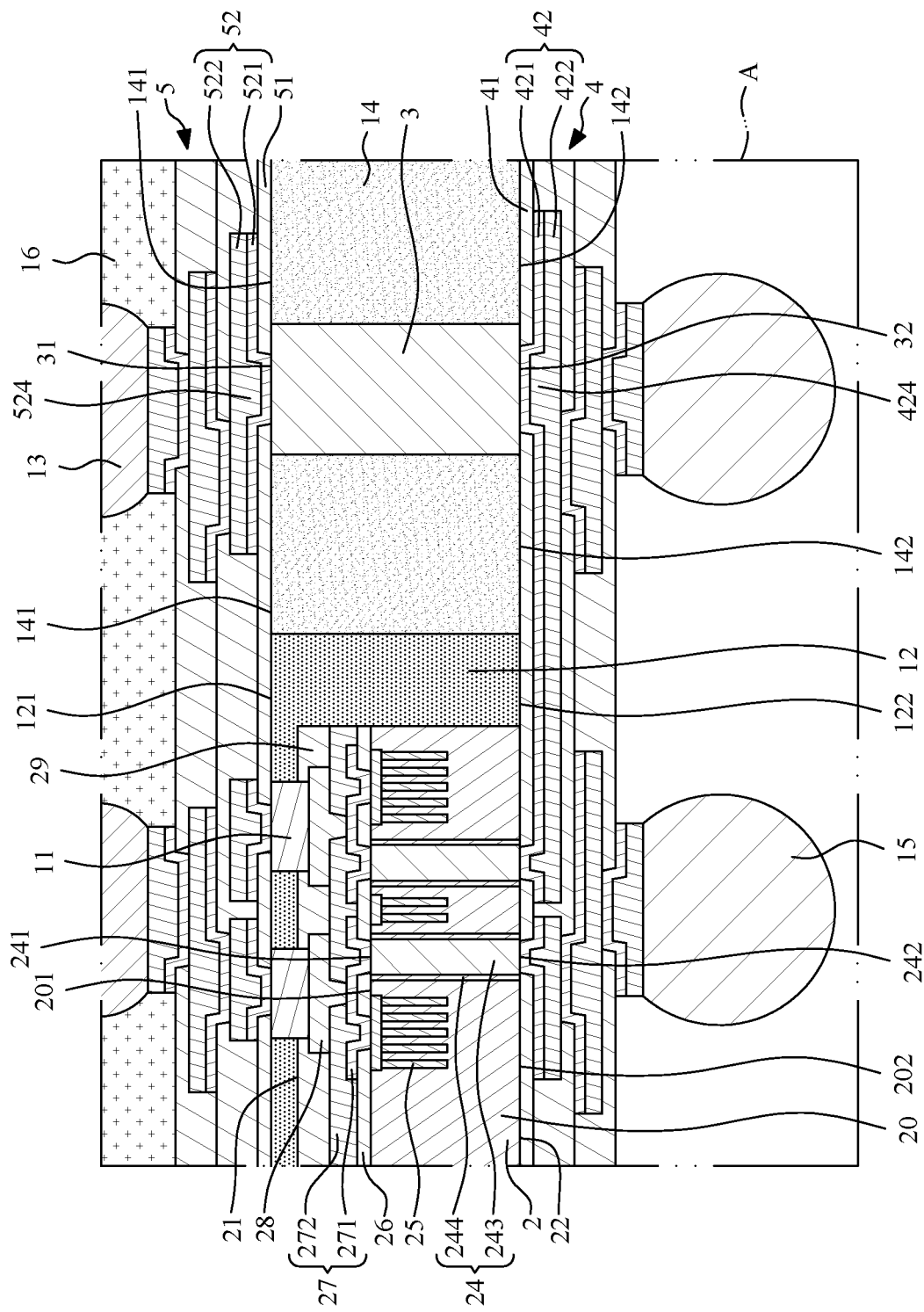
FIG. 2 illustrates an enlarged view of the region "A" in FIG. 1.

FIG. 1 illustrates a cross sectional view of a semiconductor package structure 1 according to some embodiments of the present disclosure. FIG. 2 illustrates an enlarged view of a region "A" shown in FIG. 1. The semiconductor package structure 1 may include a first electronic component 2, at least one conductive element 3, a first encapsulant 12, a second encapsulant 14, a first redistribution structure 4, an external connecter 15, a second redistribution structure 5, a second electronic component 6, a solder material 13 and a package body 16.

The first electronic component 2 has a first surface 22 and a second surface 21 opposite to the first surface 22, and includes a first conductive via 24 exposed from the first surface 22. For example, the first electronic component 2 includes a main body 20, an electrical element (e.g., a deep trench capacitor (DTC) 25), a first dielectric layer 26, a circuit structure 27, a conductive pad 28 and a second dielectric layer 29.

The main body 20 has a first surface 201 and a second surface 202 opposite to the first surface 201. A material of the main body 20 may be silicon or glass. The first surface 22 of the first electronic component 2 may be the second surface 202 of the main body 20. The first conductive via 24 extends through the main body 20 from the first surface 201 to the second surface 202. The first conductive via 24 may have a first surface 242 and a second surface 241 opposite to the first surface 242. The second surface 241 may be substantially coplanar with the first surface 201 of the main body 20. The first surface 242 may be substantially coplanar with the second surface 201 of the main body 20 and the first surface 22 of the first electronic component 2. In other words, the end surface 242 of the first conductive via 24 is exposed from the first surface 22 of the first electronic component 2. Referring to FIG. 2, the first conductive via 24 may include a conductive portion 243 and an insulation layer 244. The insulation layer 244 may surround or be disposed at a periphery of the conductive portion 243. In some embodiments, the insulation layer 244 may be omitted.

The electrical element (e.g., the DTC 25) is embedded in the main body 20, and a portion of the electrical element (e.g., the DTC 25) may be exposed from the main body 20. In some embodiments, the electrical element (e.g., the DTC 25) is disposed adjacent to the second surface 21 of the first electronic component 2. Thus, the second surface 21 of the first electronic component 2 may be an active surface, and the first surface 22 of the first electronic component 2 may be a backside surface. In some embodiments, the electrical element may be transistor, resistor, transducer or other element.

The first dielectric layer 26 is disposed on the first surface 201 of the main body 20. The circuit structure 27 is disposed on the first dielectric layer 26. The circuit structure 27 may be a back end of line (BEOL). Referring to FIG. 2, the circuit structure 27 may include a conductive layer 271 and a passivation layer 272 disposed thereon. Portions of the conductive layer 271 of the circuit structure 27 extend through the first dielectric layer 26 to contact and electrically connect the first conductive via 24 and the DTC 25. In some embodiments, the circuit structure 27 may include more than one conductive layers 271 and more than one passivation layers 272. The conductive pad 28 is disposed on and configured to electrically connect the circuit structure 27. For example, a portion of the conductive pad 28 extends through the passivation layer 272 to contact the conductive layer 271. The second dielectric layer 29 is disposed on and covers the circuit structure 27 and at least a portion of the conductive pad 28. In some embodiments, the first electronic component 2 may further include a short pillar 11 disposed on and configured to electrically connect the conductive pad 28.

The conductive element 3 is disposed adjacent to the first electronic component 2. The conductive element 3 has a second surface 31 and a first surface 32 opposite to the second surface 31. In some embodiments, the first surface 32 of the conductive element 3 may be substantially coplanar with the first surface 242 of the first conductive via 24 of the first electronic component 2. In some embodiments, the semiconductor package structure 1 may include a plurality of the conductive elements 3. The conductive elements 3 may surround the first electronic component 2. In some embodiments, the conductive element 3 may be a conductive pillar.

Figure 3:
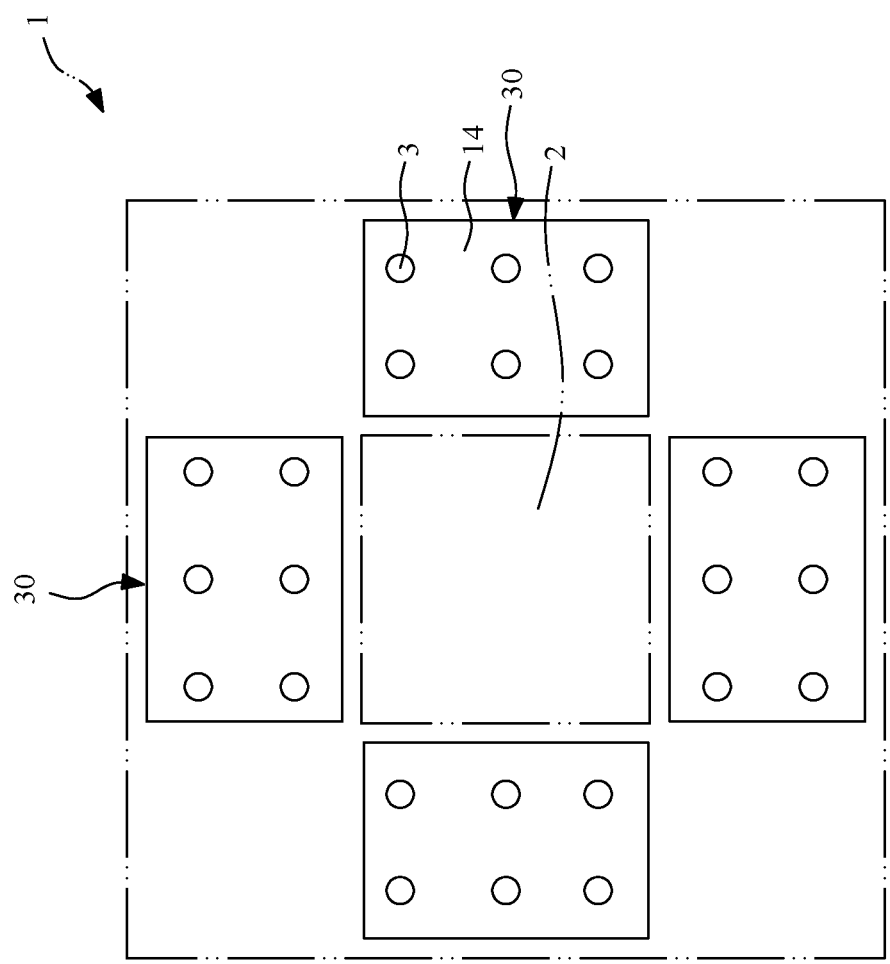
FIG. 3 illustrates an arrangement of conductive components in the semiconductor package structure shown in FIG. 1.
Figure 4:
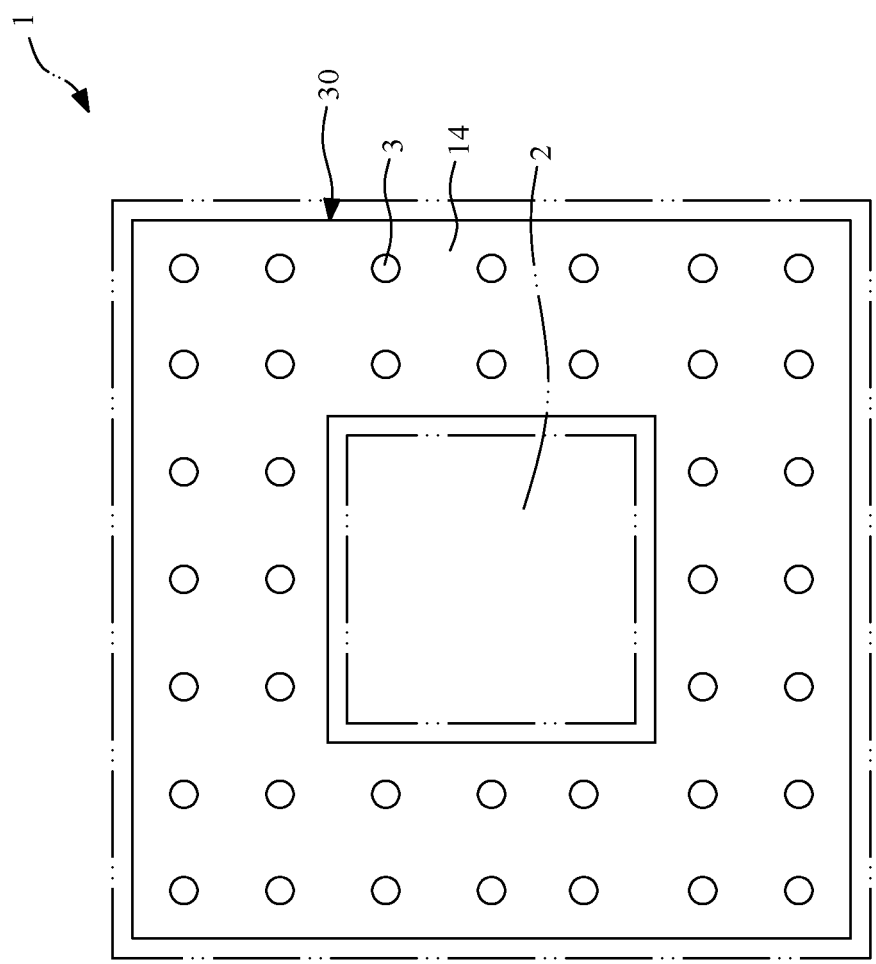
FIG. 4 illustrates another arrangement of conductive components in the semiconductor package structure shown in FIG. 1.

The first encapsulant 12 surrounds or encapsulates the first electronic component 2 and the conductive elements 3. In some embodiments, the conductive elements 3 are provided in a conductive component 30 (FIG. 3). The conductive component 30 includes the conductive elements 3 and a second encapsulant 14 encapsulating the conductive elements 3. That is the conductive elements and the second encapsulant 14 are integrated as a pre-formed component. The first encapsulant 12 surrounds or encapsulates the conductive component 30. That is, the first encapsulant 12 surrounds or encapsulates the second encapsulant 14. The second encapsulant 14 physically separates the conductive element 3 from the first encapsulant 12. For example, as shown in FIG. 3, the semiconductor package structure 1 may include four separate conductive components 30 respectively disposed adjacent to four side surfaces of the first electronic component 2. In other embodiments, as shown in FIG. 4, the conductive component 30 may be in a ring shape which surrounds the first electronic component 2.

The first encapsulant 12 has a first surface 121 and a second surface 122 opposite to the first surface 121. The second encapsulant 14 also has a first surface 141 and a second surface 142 opposite to the first surface 141. The first surface 121 and the second surface 122 of the first encapsulant 12 may respectively be substantially coplanar with the first surface 141 and the second surface 142 of the second encapsulant 14. Besides, the second surface 122 of the first encapsulant 12 and the second surface 142 of the second encapsulant 142 may be substantially coplanar with the first surface 32 of the conductive element 3 and the first surface 242 of the first conductive via 24 of the first electronic component 2. However, in some embodiments, the first surface 242 of the first conductive via 24, the first surface 22 of the first electronic component 2 and the second surface 142 of the second encapsulant 14 may slightly protrude from the second surface 122 of the first encapsulant 2.

The first redistribution structure 4 may be disposed on the first encapsulant 12, such as the second surface 122 of the first encapsulant 12. The first surface 22 of the first electronic component 2 faces the first redistribution structure 4. For example, the first redistribution structure 4 is disposed below the first surface 22 of the first electronic component 2. The first redistribution structure 4 includes a dielectric layer 41 and a redistribution layer 42. As shown in FIG. 1, the first redistribution structure 4 may include three dielectric layers 41 and three redistribution layers 42. However, the amount of the dielectric layers 41 and the amount of the redistribution layers 42 are not limited in the present disclosure. Referring to FIG. 2, the redistribution layer 42 may include a seed layer 421 and a conductive layer 422 disposed thereon. In some embodiments, the seed layer 421 may be omitted. The redistribution layer 42 of first redistribution structure 4 includes a second conductive via 424 closer to the first surface 22 of the first electronic component 2 than the second surface 21 of the first electronic component 2. The second conductive via 424 tapers toward the first electronic component 2 and/or the conductive element 3. The first redistribution structure 4 is configured to electrically connect the first electronic component 2 and the conductive element 3. For example, the redistribution layer 42 of the first redistribution structure 4 may directly contact the first surface 242 of the first conductive via 24 of the first electronic component 2 and the first surface 32 of the conductive element 3. The first surface 242 of the first conductive via 24 of the first electronic component 2 and the first surface 32 of the conductive element 3 are electrically connected by a single redistribution layer 42, such as a topmost redistribution layer 42, as shown in FIGS. 1 and 2. That is, an electrical path between the redistribution layer 42 of the first redistribution structure 4 and the first conductive via 24 of the first electronic component 2 passes through only one boundary. The first redistribution structure 4 ensures that the first conductive via 24 of the first electronic component 2 and the conductive element 3 can be electrically connected through a shorter path. The electrical element (e.g., the DTC 25) may be configured to electrically connect the first redistribution structure 4. The external connector 15 is disposed on and configured to electrically connect the first redistribution structure 4.

The second redistribution structure 5 may be disposed on the first encapsulant 12, such as the first surface 121 of the first encapsulant 12. For example, the second redistribution structure 5 is disposed above the second surface 21 of the electronic component 2. The second redistribution structure 5 is configured to electrically connect the first redistribution structure 4 through the first conductive via 24 of the first electronic component 2. In some embodiments, the conductive element 3 is configured to electrically connect the first redistribution structure 4 to the second redistribution structure 5. The second redistribution structure 5 includes a dielectric layer 51 and a redistribution layer 52. As shown in FIG. 1, the second redistribution structure 5 may include three dielectric layers 51 and three redistribution layers 52. However, the amount of the dielectric layers 51 and the amount of the redistribution layers 52 are not limited in the present disclosure. Referring to FIG. 2, the redistribution layer 52 may include a seed layer 521 and a conductive layer 522. In some embodiments, the seed layer 521 may be omitted. The redistribution layer 52 of second redistribution structure 5 includes a third conductive via 524 closer to the second surface 21 of the first electronic component 2 than the first surface 22 of the first electronic component 2. The third conductive via 524 tapers toward the first electronic component 2 and/or the conductive element 3. That is, the tapering direction of the third conductive via 524 of the second redistribution structure 5 is opposite to the tapering direction of the second conductive via 424 of the first redistribution structure 4. The second redistribution structure 5 is configured to electrically connect to the second surface 21 of the first electronic component 2 and the conductive element 3. For example, the redistribution layer 52 may contact the short pillar 11 of the first electronic component 2 and the second surface 31 of the conductive element 3. The electrical element (e.g., the DTC 25) may be configured to electrically connect the second redistribution structure 5. In addition, a portion of the first encapsulant 12 may be interposed between the second redistribution structure 5 and the first electronic component 2 and encapsulate the short pillar 11. Thus, the first encapsulant 12 may cover and contact the second surface 21 of the first electronic component 2.

The second electronic component 6 is disposed on and is configured to electrically connect the upper redistribution layer 5. For example, the second electronic component 6 may include a plurality of bump pads 64, and the bump pads 64 may be electrically connected to the second redistribution structure 5 through a plurality of solder materials 13. The package body 16 (e.g., a molding compound) may be disposed on the second redistribution structure 5 and encapsulate the second electronic component 6. In some embodiments, the second electronic component 6 may be a semiconductor die.

In the semiconductor package structure 1, an electrical path between the redistribution layer 42 of the first redistribution structure 4 and the first conductive via 24 of the first electronic component 2 passes through only one boundary. Thus, the first conductive via 24 of the first electronic component 2 and the conductive element 3 can be electrically connected through a shorter path. The electrical performance of the semiconductor package structure 1 may be improved. In addition, the electrical element (e.g., the DTC 25) is disposed in a position close to the second electronic component 6. For example, the electrical element (e.g., the DTC 25) is closer to the second surface 21 of the first electronic component 2 than the first surface 22 of the first electronic component 22, thus the electrical element (e.g., the DTC 25) is disposed in a position close to the second electronic component 6. Hence, an electrical path from the electrical element (e.g., the DTC 25) to the second electronic component 6 may be shortened, thus further improving the electrical performance of the semiconductor package structure 1. Besides, since the tapering direction of the third conductive via 524 of the second redistribution structure 5 is opposite to the tapering direction of the second conductive via 424 of the first redistribution structure 4, the thermal expansion at top portion and the bottom portion of the semiconductor package structure 1 may be balanced. Hence, warpage of the semiconductor package structure 1 may be prevented.

Figure 5:
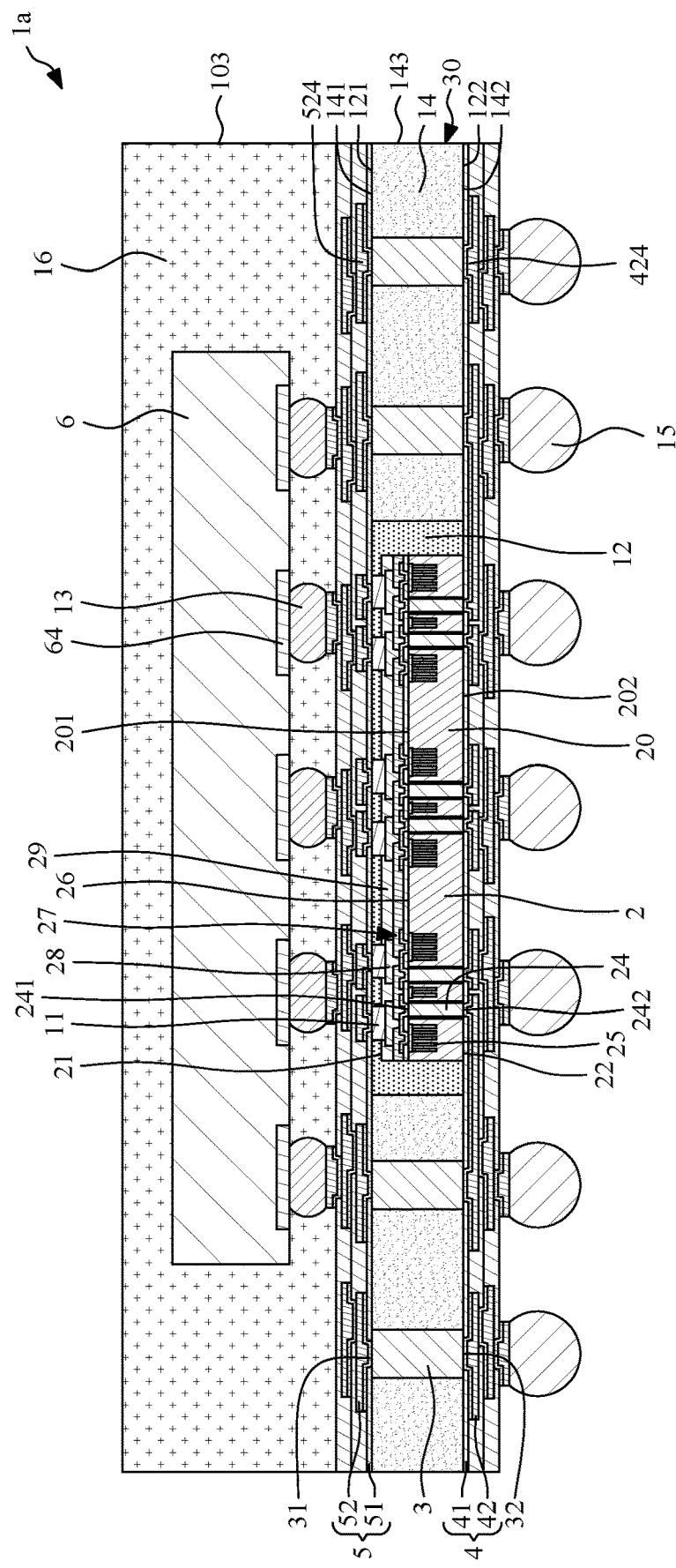
FIG. 5 illustrates a cross sectional view of a semiconductor package structure according to some embodiments of the present disclosure.

FIG. 5 illustrates a cross sectional view of a semiconductor package structure 1a according to some embodiments of the present disclosure. The semiconductor package structure 1a is similar to the semiconductor package structure 1 shown in FIGS. 1 and 2, except that a side surface 143 of the second encapsulant 14 is exposed from a side surface 103 of the semiconductor package structure 1.

Figure 6:
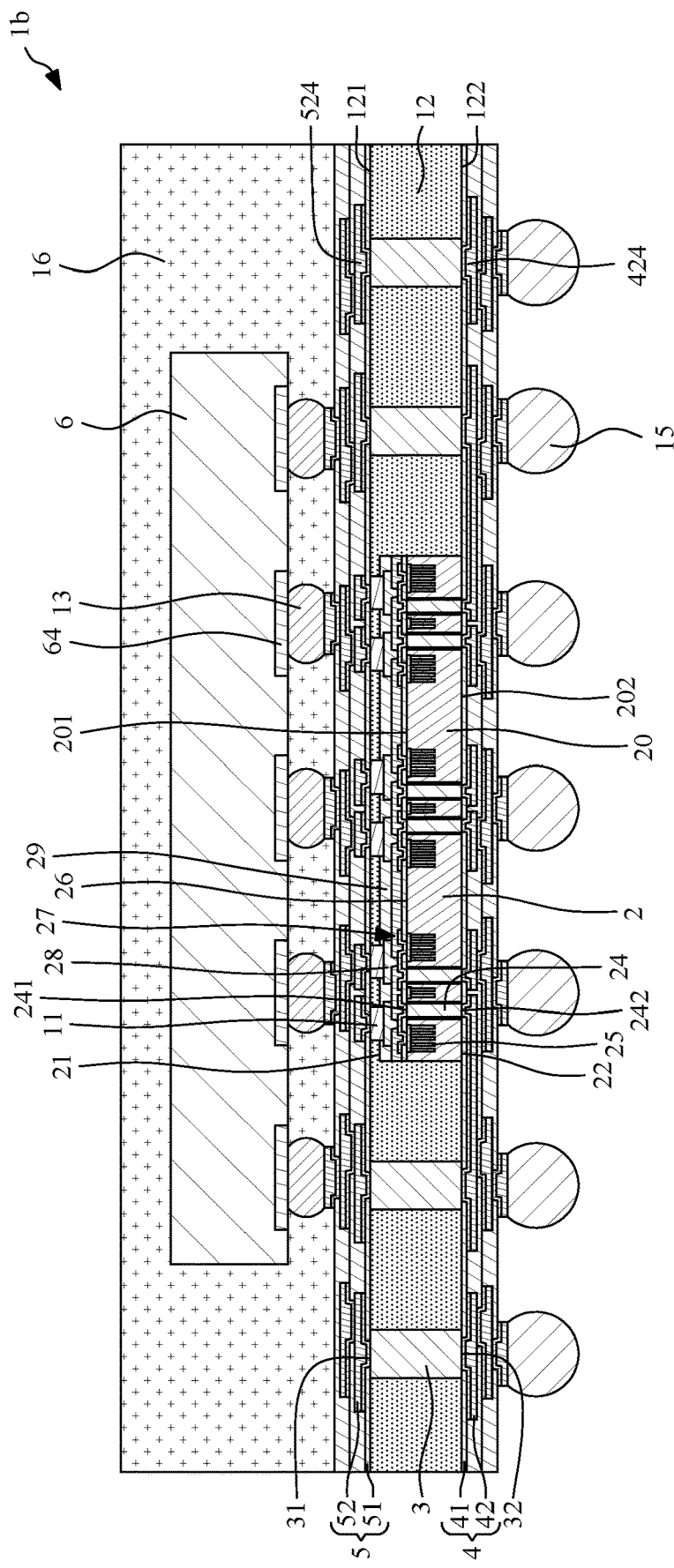
FIG. 6 illustrates a cross sectional view of a semiconductor package structure according to some embodiments of the present disclosure.

FIG. 6 illustrates a cross sectional view of a semiconductor package structure 1b according to some embodiments of the present disclosure. The semiconductor package structure 1b is similar to the semiconductor package structure 1 shown in FIGS. 1 and 2, except that the second encapsulant 14 is omitted. Accordingly, the first encapsulant 12 directly contacts and encapsulates the conductive element 3.

Figure 7:
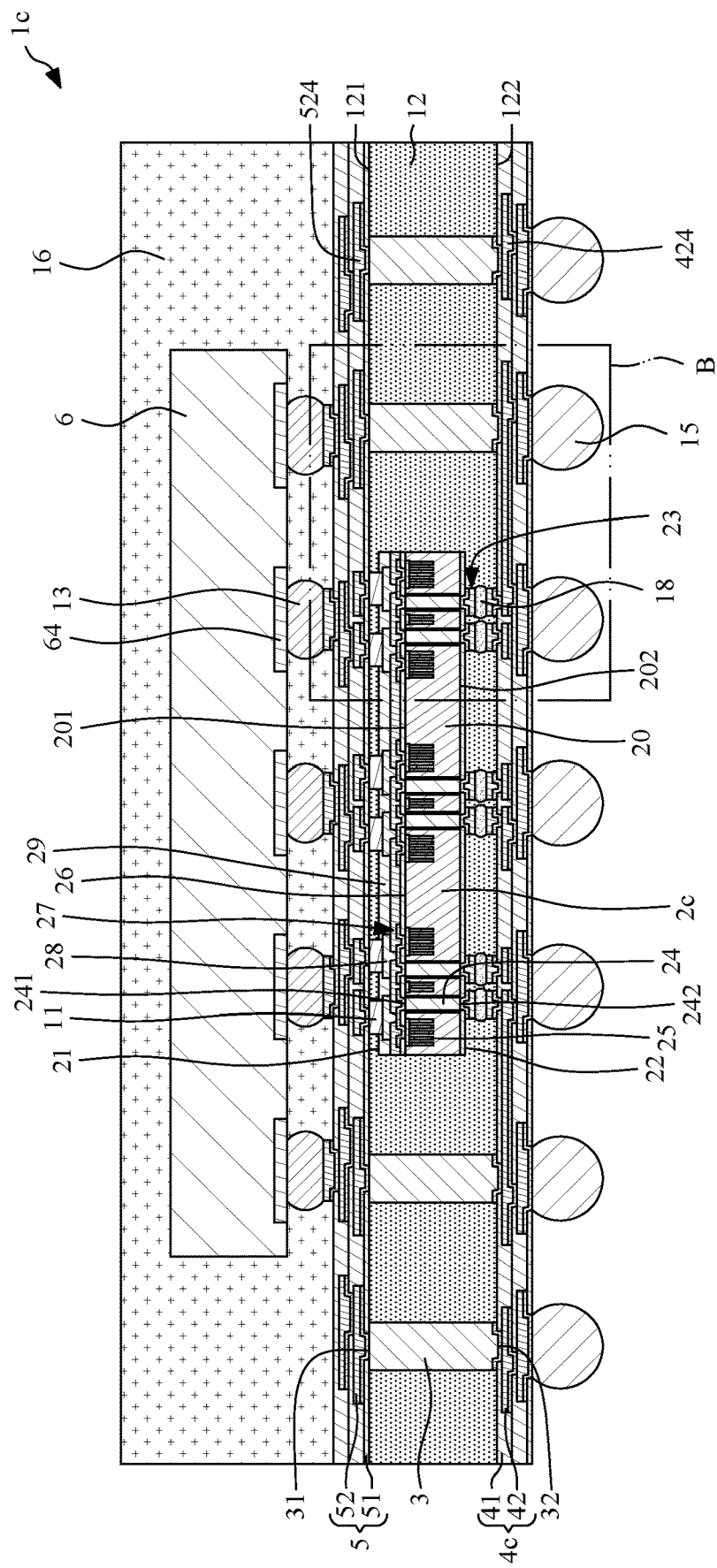
FIG. 7 illustrates a cross sectional view of a semiconductor package structure according to some embodiments of the present disclosure.
Figure 8:
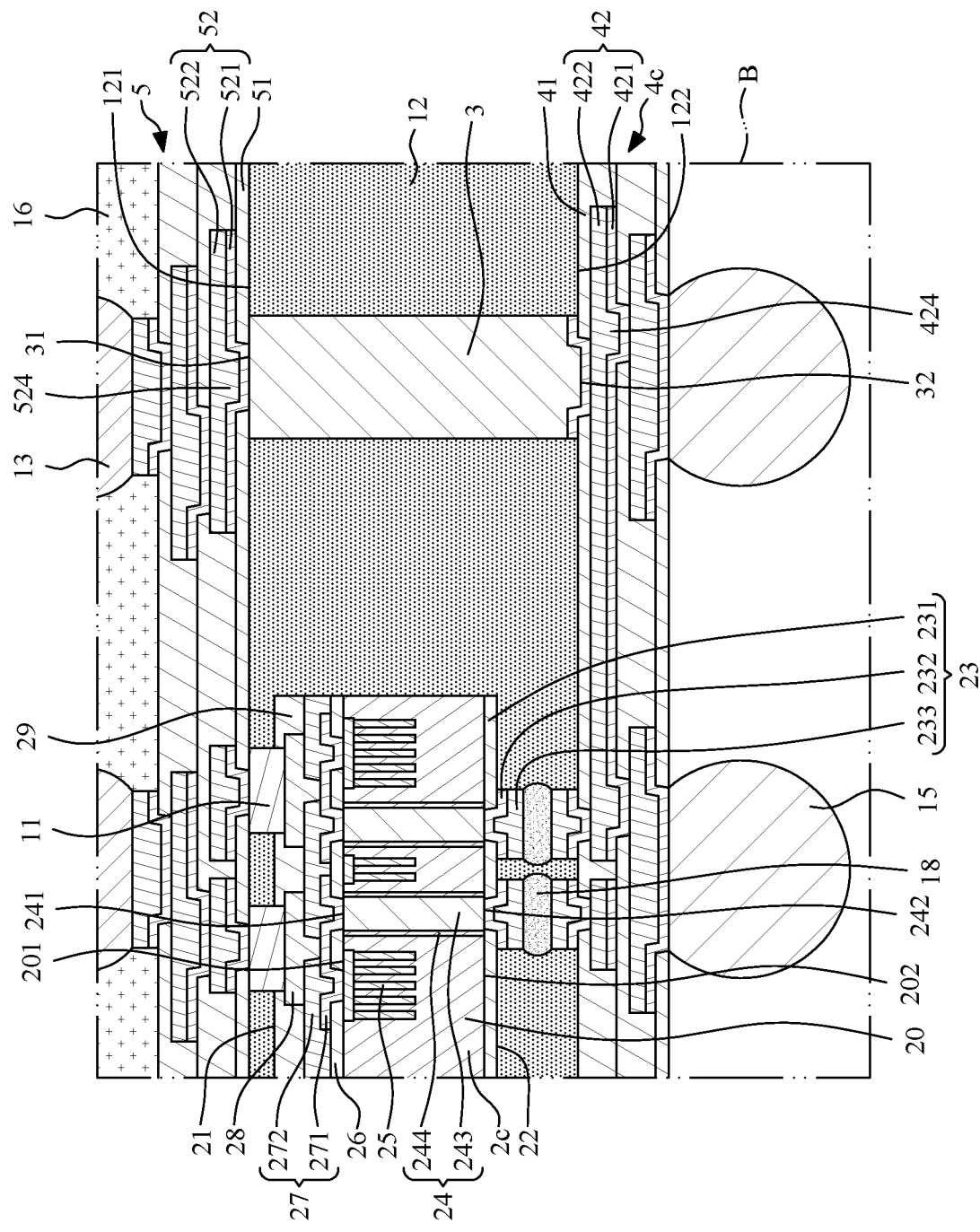
FIG. 8 illustrates an enlarged view of the region "B" in FIG. 7.

FIG. 7 illustrates a cross sectional view of a semiconductor package structure 1c according to some embodiments of the present disclosure. FIG. 8 illustrates an enlarged view of a region "B" shown in FIG. 7. The semiconductor package structure 1c is similar to the semiconductor package structure 1b shown in FIG. 6, except for the follows.

The first electronic component 2c and the first redistribution structure 4c are similar to those shown in FIG. 6. However, as shown in FIGS. 7 and 8, the first electronic component 2c does not directly contact the first redistribution structure 4c. For example, the first electronic component 2c may further include a conductive structure 23. The conductive structure 23 is disposed on the second surface 202 of the main body 20 and is configured to electrically connect the first conductive via 24. Referring to FIG. 8, the conductive structure 23 may include a dielectric layer 231, a seed layer 232 and a conductive layer 233. The seed layer 232 and the conductive layer 233 may serve as a bump pad for electrical connection. A solder material 18 is disposed on the conductive layer 233, and is configured to electrically connect the first electronic component 2c to the lower redistribution layer 4c. The first surface 242 of the first conductive via 24 and the first surface 22 of the first electronic component 2c may be higher than the second surface 122 of the first encapsulant 12. A portion of the first encapsulant 12 may be interposed between the first surface 22 of the first electronic component 2 and the first redistribution structure 4c. Thus, the first encapsulant 12 may cover and contact the first surface 22 of the first electronic component 2.

As shown in FIGS. 7 and 8, the end surface 32 of the conductive element 3 is not coplanar with the second surface 122 of the first encapsulant 12. Referring to FIG. 8, the conductive element 3 may be directly formed on the outermost seed layer 421 of the redistribution layer 42. Hence, the end surface 32 of the conductive element 3 may slightly protrude from the second surface 122 of the first encapsulant 12. The first surface 32 of the conductive element 3 is not coplanar with the first surface 242 of the first conductive via 24 of the first electronic component 2.

The first redistribution structure 4c in the semiconductor package structure 1c is disposed in a direction opposite to the first redistribution structure 4 shown in FIG. 6. That is, the redistribution layer 42 includes a second conductive via 424 closer to the first surface 22 of the first electronic component 2 than the second surface 21 of the first electronic component 2. The second conductive via 424 tapers away from the first electronic component 2 and/or the conductive element 3.

In the semiconductor package structure 1c shown in FIGS. 7 and 8, the solder material 18 can enhance the electrical connection between the first electronic component 2c and the first redistribution structure 2c, and can fix the position of the first electronic component 2c relative to the first redistribution structure 4c. The portion of the first encapsulant 12 interposed between the first electronic component 2c and the first redistribution structure 4c can protect the conductive structure 23 and the solder material 18. In addition, during the manufacturing process, the solder material 18 may facilitate the self alignment of the first electronic component 2.

Figure 9:
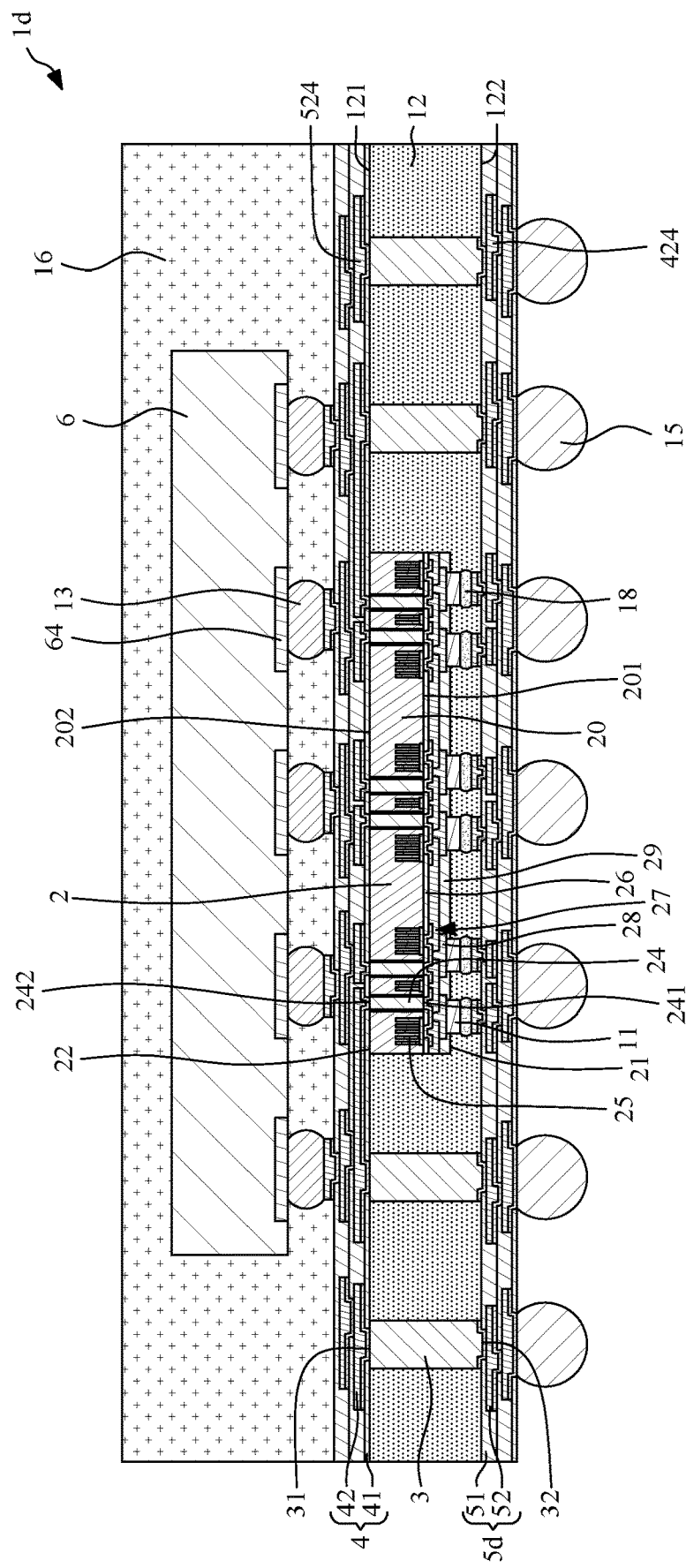
FIG. 9 illustrates a cross sectional view of a semiconductor package structure according to some embodiments of the present disclosure.

FIG. 9 illustrates a cross sectional view of a semiconductor package structure 1d according to some embodiments of the present disclosure. The semiconductor package structure 1d is similar to the semiconductor package structure 1c shown in FIGS. 7 and 8, except for the direction of the first electronic component 2, and the arrangement of the first redistribution structure 4 and the second redistribution structure 5d.

Referring to FIG. 9, the first electronic component 2 is disposed in a direction opposite to that shown in FIG. 6. That is, the second surface 21 of the first electronic component 2 is adjacent to the second surface 122 of the first encapsulant 12, while the first surface 22 of the first electronic component 2 is substantially coplanar with and exposed from the first surface 121 of the first encapsulant 12.

The first redistribution structure 4 is disposed on the first surface 121 of the first encapsulant 12 to electrically connect the first electronic component 2 and the conductive element 3. For example, the redistribution layer 42 of the first redistribution structure 4 may directly contact the first surface 242 of the first conductive via 24 of the first electronic component 2 and the second surface 31 of the conductive element 3. The first redistribution structure 4 ensures that the first conductive via 24 of the first electronic component 2 and the conductive element 3 can be electrically connected through a shorter path. The second electronic component 6 is disposed on and is configured to electrically connect the first redistribution structure 4.

The second redistribution structure 5d is disposed on the second surface 122 of the first encapsulant 12. The redistribution layer 52 of the second redistribution structure 5d includes a third conductive via 524 closer to the second surface 21 of the first electronic component 2 than the first surface 22 of the first electronic component 2. The third conductive via 524 tapers away from the first electronic component 2 and/or the conductive element 3. A solder material 18 is disposed on the short pillar 11 of the electronic component and is configured to electrically connect the first electronic component 2 to the second redistribution layer 5d. The external connector 15 is disposed on and is configured to electrically connect the second redistribution structure 5d.

Figure 10:
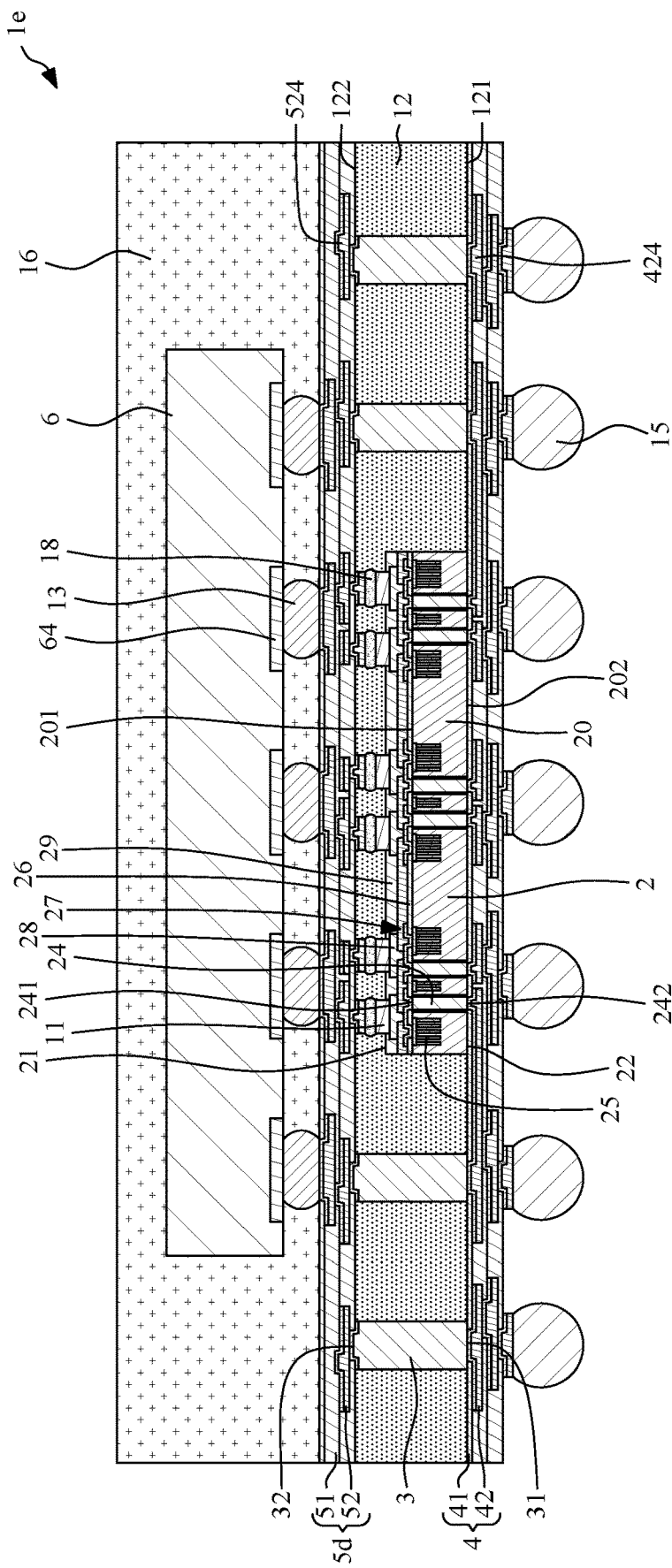
FIG. 10 illustrates a cross sectional view of a semiconductor package structure according to some embodiments of the present disclosure.

FIG. 10 illustrates a cross sectional view of a semiconductor package structure 1e according to some embodiments of the present disclosure. The semiconductor package structure 1e is similar to the semiconductor package structure 1d shown in FIG. 9, except for the follows.

As shown in FIG. 10, the middle section of the semiconductor package structure 1e, from the first redistribution structure 4 to the second redistribution structure 5d, are arranged in a direction opposite to that shown in FIG. 9. The is, the second electronic component 6 is disposed on and is configured to electrically connect the second redistribution structure 5*d*, while the external connector 15 is configured to electrically connect the first redistribution structure 4.

Figure 11:
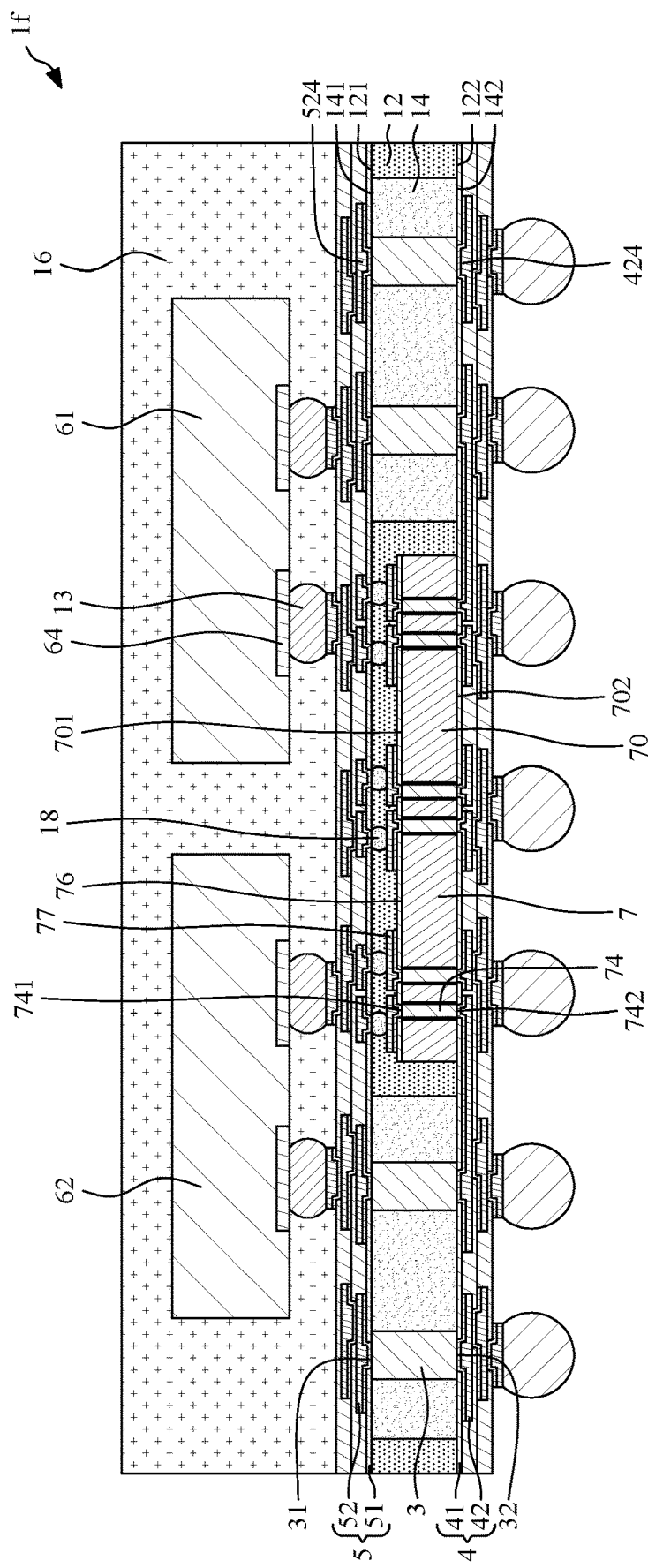
FIG. 11 illustrates one or more stages of an example of a method for manufacturing a semiconductor package structure according to some embodiments of the present disclosure.

FIG. 11 illustrates a cross sectional view of a semiconductor package structure if according to some embodiments of the present disclosure. The semiconductor package structure if is similar to the semiconductor package structure 1 shown in FIGS. 1 and 2, except that the first electronic component is a bridge die 7, and the semiconductor package structure if includes a second electronic component 61 and a third electronic component 62.

The bridge die 7 has a first surface 71 and a second surface 72 opposite to the first surface 71. The bridge die 7 includes a main body 70, a through via 74, a dielectric layer 76 and a conductive layer 77. The main body 70 has a first surface 701 and a second surface 702 opposite to the first surface 701. The second surface 702 of the main body 70 may be the second surface 72 of the bridge die 7. The through via 74 extends through the main body 70. The through via 74 has a second surface 741 and a first surface 742 which are respectively exposed from the first surface 701 and the second surface 702 of the main body 70. The dielectric layer 76 is disposed on the first surface 701 of the main body 70. The conductive layer 77 is disposed on the dielectric layer 76, and a portion of the conductive layer 77 extends through the dielectric layer 76 to electrically connect the second surface 741 of the through via 72. A solder material 78 is configured to electrically connect the through via 74 to the second redistribution structure 5. The first redistribution structure 4 is configured to electrically connect the through via 74 of the bridge die 7 and the conductive element 3. For example, the redistribution layer 42 may directly contact the first surface 742 of the through via 74 of the bridge die 7 and the first surface 32 of the conductive element 3.

The second electronic component 61 and the third electronic component 62 both are configured to electrically connect the second redistribution structure 5. Signals from the second electronic component 61 and the third electronic component 62 may be transmitted to each other through the second redistribution structure 5 and the bridge die 7. In some embodiments, the second electronic component 61 and the third electronic component 62 may be semiconductor dice with same or different functions.

Figure 11A:
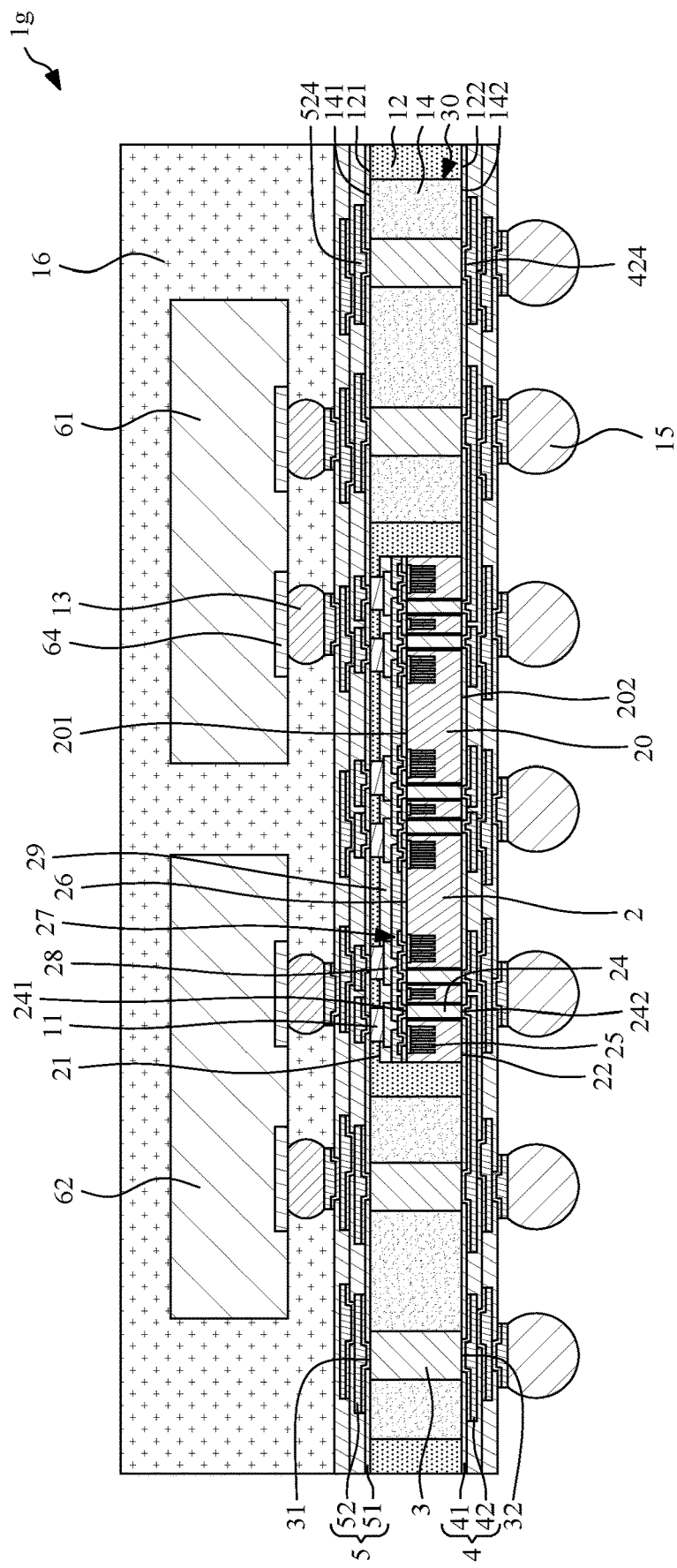
FIG. 11A illustrates one or more stages of an example of a method for manufacturing a semiconductor package structure according to some embodiments of the present disclosure.

FIG. 11A illustrates a cross sectional view of a semiconductor package structure 1*g* according to some embodiments of the present disclosure. The semiconductor package structure 1*g* is similar to the semiconductor package structure 1 shown in FIGS. 1 and 2, except that the semiconductor package structure 1*g* includes a second electronic component 61 and a third electronic component 62.

The second electronic component 61 and the third electronic component 62 both are configured to electrically connect the second redistribution structure 5. The first electronic component 2 is configured for signal transmission between the second electronic component 61 and the third electronic component 63. Signals from the second electronic component 61 and the third electronic component 62 may be transmitted to each other through the second redistribution structure 5 and the bridge die 7. In some embodiments, the second electronic component 61 and the third electronic component 62 may be semiconductor dice with same or different functions.

FIG. 12 through FIG. 19 illustrate a method for manufacturing a semiconductor package structure according to some embodiments of the present disclosure. In some embodiments, the method is for manufacturing the semiconductor package structure 1 shown in FIGS. 1 and 2.

Figure 12:
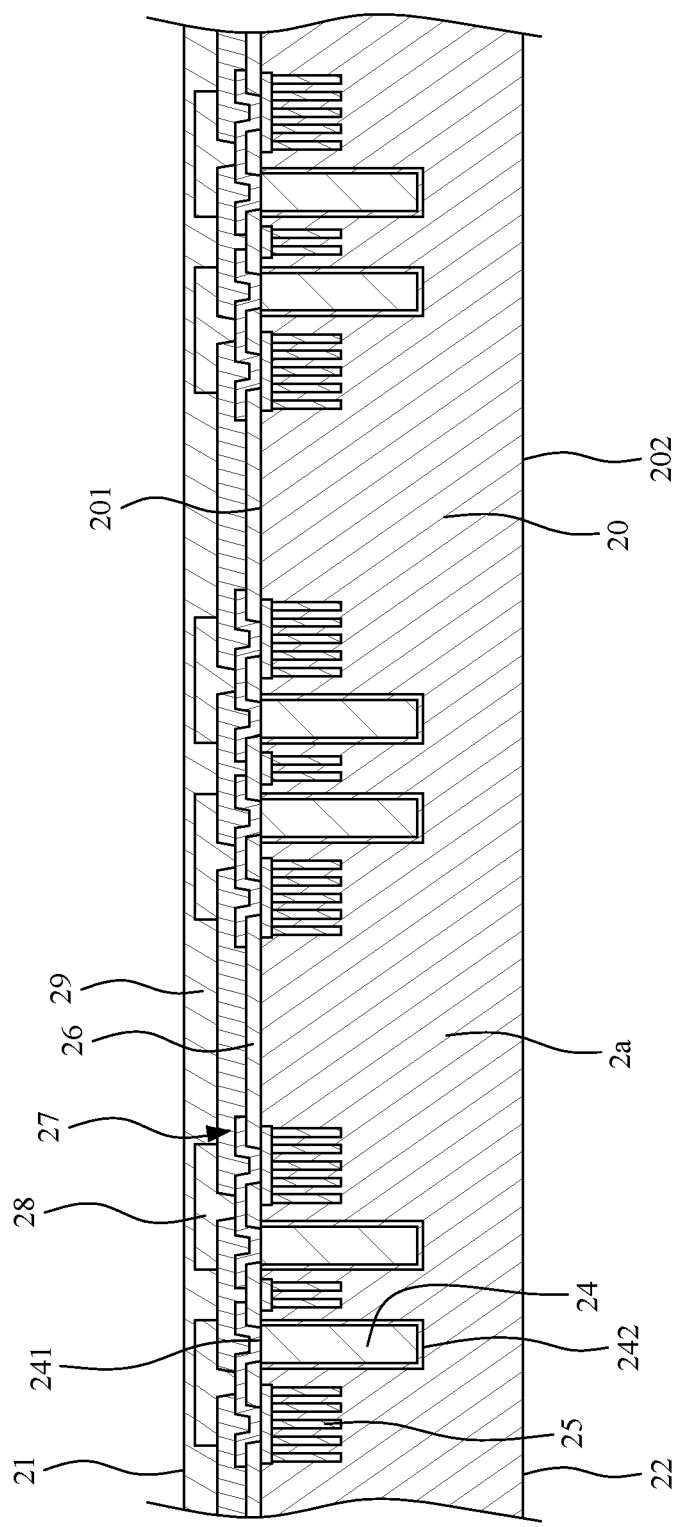
FIG. 12 illustrates one or more stages of an example of a method for manufacturing a semiconductor package structure according to some embodiments of the present disclosure.

Referring to FIG. 12, a first electronic component 2*a* is provided. For example, a plurality of the first electronic components 2*a* may be provided in a wafer. Similar to the first electronic component 2 shown in FIGS. 1 and 2, the first electronic component 2*a* also includes a main body 20, a first conductive via 24, a DTC 25, a first dielectric layer 26, a circuit structure 27, a conductive pad 28 and a second dielectric layer 29. The first electronic component 2*a* has a first surface 22 and a second surface 21 opposite to the first surface 22. The main body 20 has a first surface 201 and a second surface 202 opposite to the first surface 201. The second surface 202 of the main body 20 may be the first surface 22 of the first electronic component 2. The first conductive via 24 has a first surface 242 and a second surface 241 opposite to the first surface 242. However, the first electronic component 2*a* does not include a short pillar 11. The second dielectric layer 29 completely covers the conductive pad 28. Besides, a first surface 242 of the first electronic component 2*a* is not exposed from a first surface 22 of the first electronic component 2.

Figure 13:
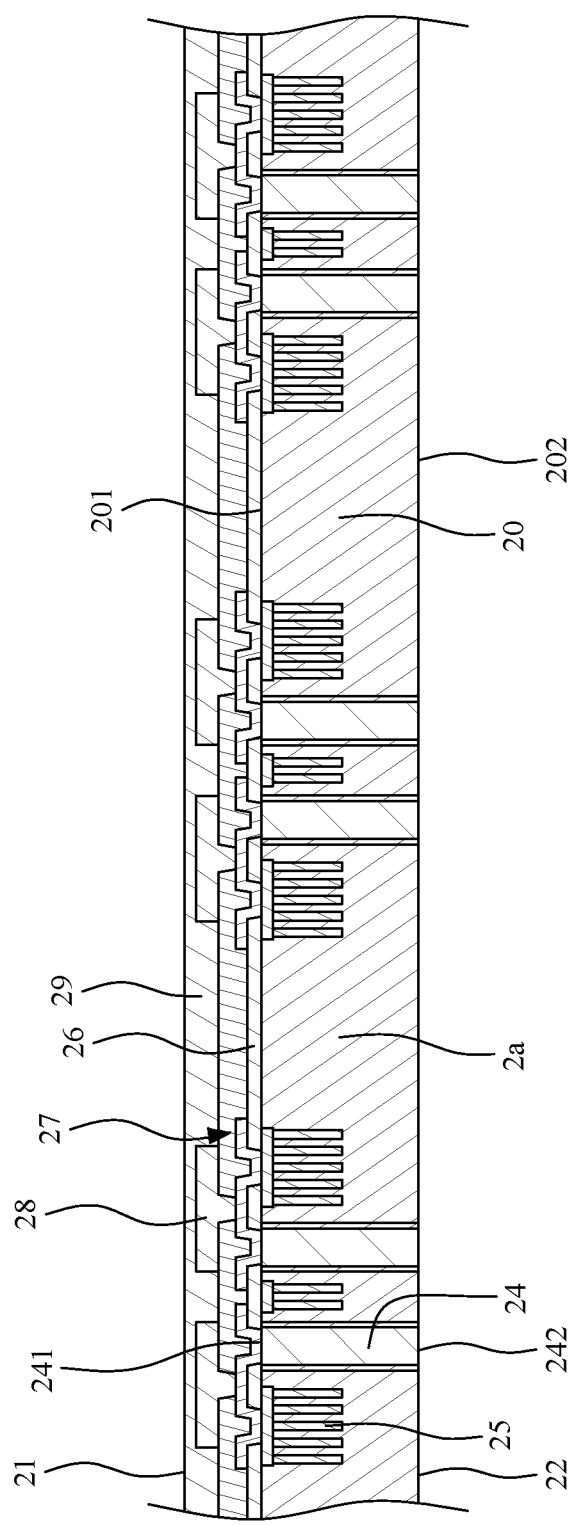
FIG. 13 illustrates one or more stages of an example of a method for manufacturing a semiconductor package structure according to some embodiments of the present disclosure.

Referring to FIG. 13, a portion of the main body 20 is removed, so as to expose the first surface 242 of the first conductive via 24 from the first surface 22 of the first electronic component 2*a*.

Figure 14:
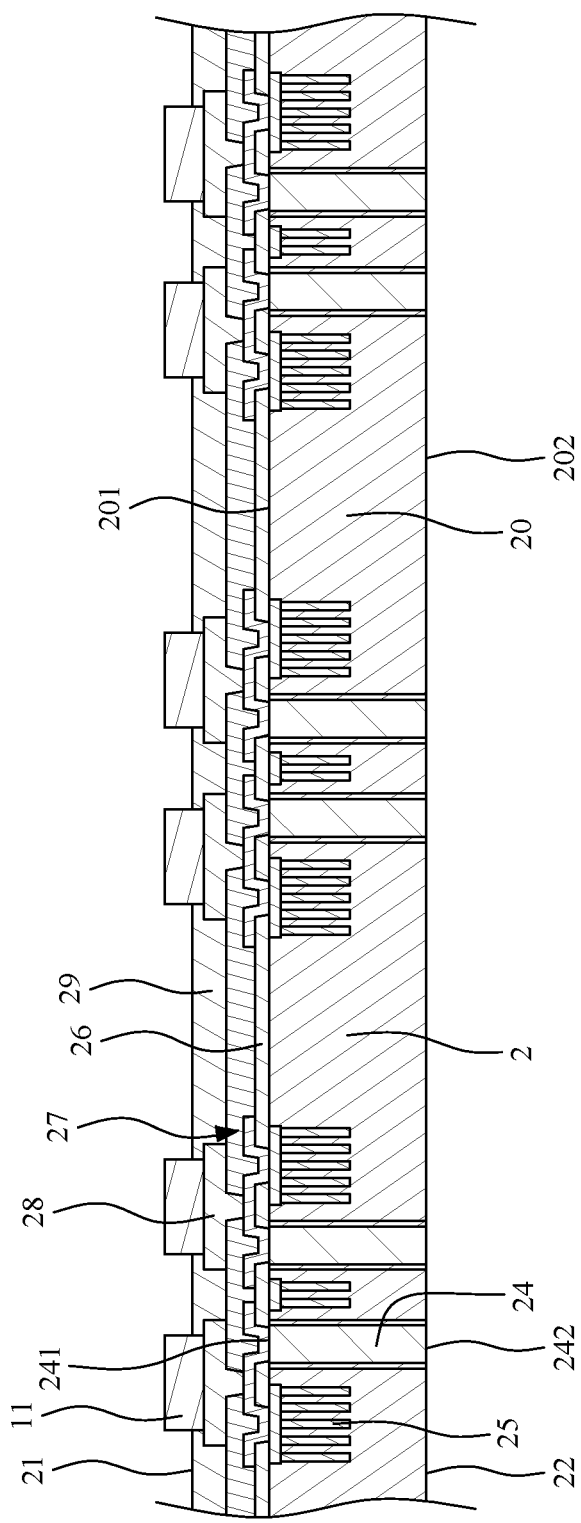
FIG. 14 illustrates one or more stages of an example of a method for manufacturing a semiconductor package structure according to some embodiments of the present disclosure.

Referring to FIG. 14, a portion of the second dielectric layer 29 is removed to expose the conductive pad 28. Then, a short pillar 11 is formed on and configured to electrically connect the conductive pad 28, thus forming a first electronic component 2. The wafer containing the plurality of the first electronic components 2 may be singulated to form each of the first electronic components 2 as shown in FIGS. 1 and 2.

Figure 15:
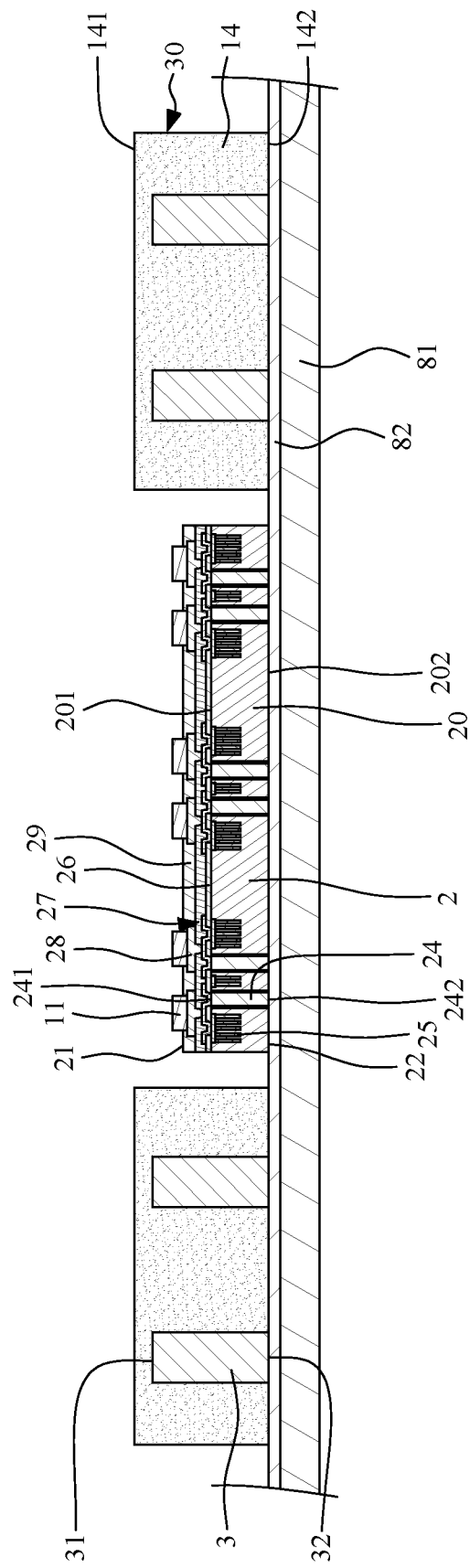
FIG. 15 illustrates one or more stages of an example of a method for manufacturing a semiconductor package structure according to some embodiments of the present disclosure.

Referring to FIG. 15, a carrier 81 and a release layer 82 disposed thereon are provided. Then, at least one conductive element 3 and the first electronic component 2 may be formed or disposed on the carrier 81. For example, the first electronic component 2 may be disposed on the carrier 81 with the second surface 21 contacting the release layer 82. As shown in FIG. 15, a plurality of the conductive elements 3 may be provided in at least one conductive component 30. The conductive component 30 includes the conductive element 3 and a second encapsulant 14 covering the conductive element 3. The conductive element 3 has a second surface 31 and a second surface 32 opposite to the first end surface 31. The second encapsulant 14 has a first surface 141 and a second surface 142 opposite to the first surface 141. As shown in FIG. 15, the second encapsulant 14 may cover second surface 31 of the conductive element 3, while the first surface 32 of the conductive element 3 may be exposed from the second surface 142 of the second encapsulant 14. The conductive component 30 may be disposed on the carrier 81 with the second surface 142 of the second encapsulant 14 contacting the release layer 82. Accordingly, the first surface 32 of the conductive element 3 may be substantially coplanar with the first surface 242 of the first conductive via 24 of the first electronic component 2.

In the aforementioned stage, the first electronic component 2 and the conductive component 30 (including the conductive elements 3 and the second encapsulant 14) can be produced separately, and then disposed together on the carrier 81. Accordingly, production time can be reduced. Besides, by using the conductive component 30, it is not necessary to form a seed layer on the carrier 81 for plating the conductive elements 3. Hence, the manufacturing process can be simplified.

Figure 16:
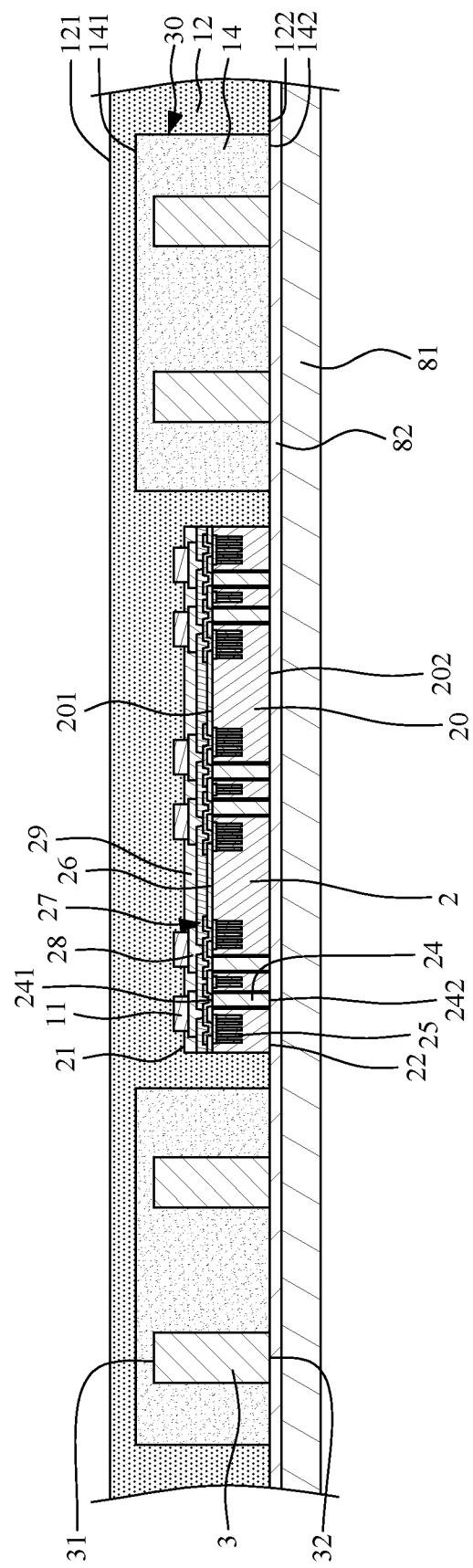
FIG. 16 illustrates one or more stages of an example of a method for manufacturing a semiconductor package structure according to some embodiments of the present disclosure.

Referring to FIG. 16, a first encapsulant 12 is formed on the carrier 81 to cover the conductive component 30 (including the conductive element 3 and the second encapsulant 14) and the first electronic component 2. The first encapsulant 12 has a second surface 21 and a first surface 22. The first surface 22 contacts the release layer 82. The first encapsulants 12 covers the second surface 21 and the short pillar 11 of the first electronic component 2. The first encapsulant 12 may also cover the first surface 141 of the second encapsulant 14. That is, the first surface 121 of the first encapsulant 12 may be higher than the first surface 141 of the second encapsulant 14.

As shown in FIG. 16, the second surface 122 of the first encapsulant 12 is substantially coplanar with the first surface 22 of the first electronic component 2 and the second surface 142 of the second encapsulant 14. However, due to the material of the release layer 82, the first electronic component 2 and the conductive component 30 (including the conductive element 3 and the second encapsulant 14) may slightly sink into the release layer 82. Hence, the first surface 22 of the first electronic component 2 and the second surface 142 of the second encapsulant 14 may slightly protrude from the second surface 122 of the first encapsulant 2.

Figure 17:
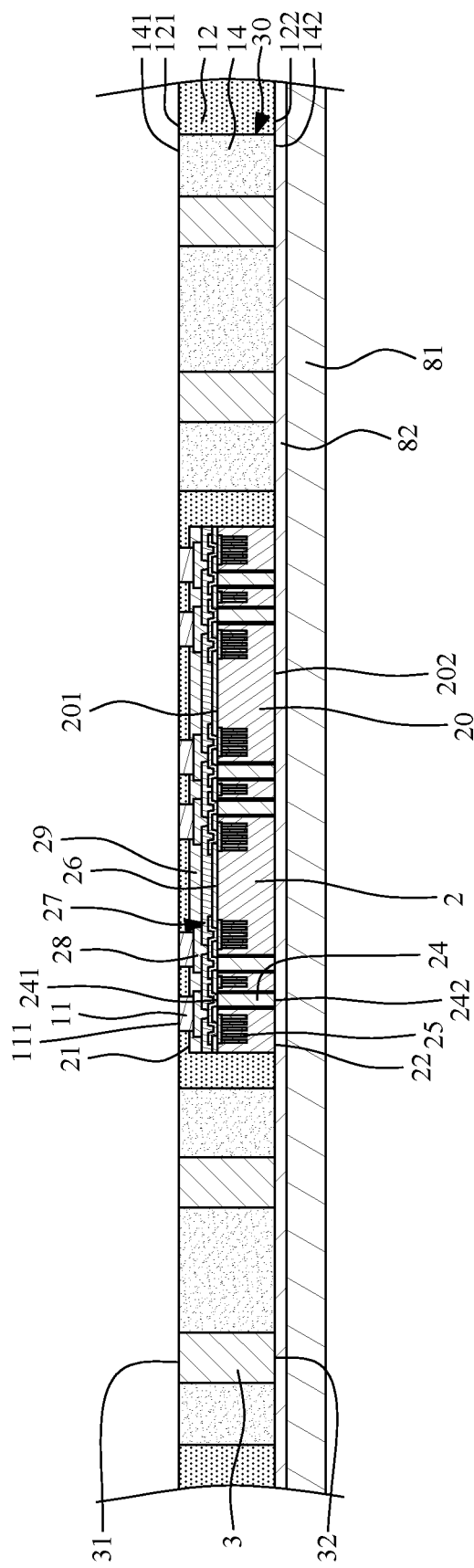
FIG. 17 illustrates one or more stages of an example of a method for manufacturing a semiconductor package structure according to some embodiments of the present disclosure.

Referring to FIG. 17, a grinding process is conducted to remove a portion of the first encapsulant 12, so as to expose the first electronic component 2 and the conductive element 3. A portion of the second encapsulant 14 may also be removed. Besides, a portion of the conductive element 3 may also be removed (i.e., the conductive element 3 may be shortened), such that the second surface 31 of the conductive element 3 may be substantially coplanar with a top surface 111 of the short pillar 11 of the first electronic component 2.

Figure 18:
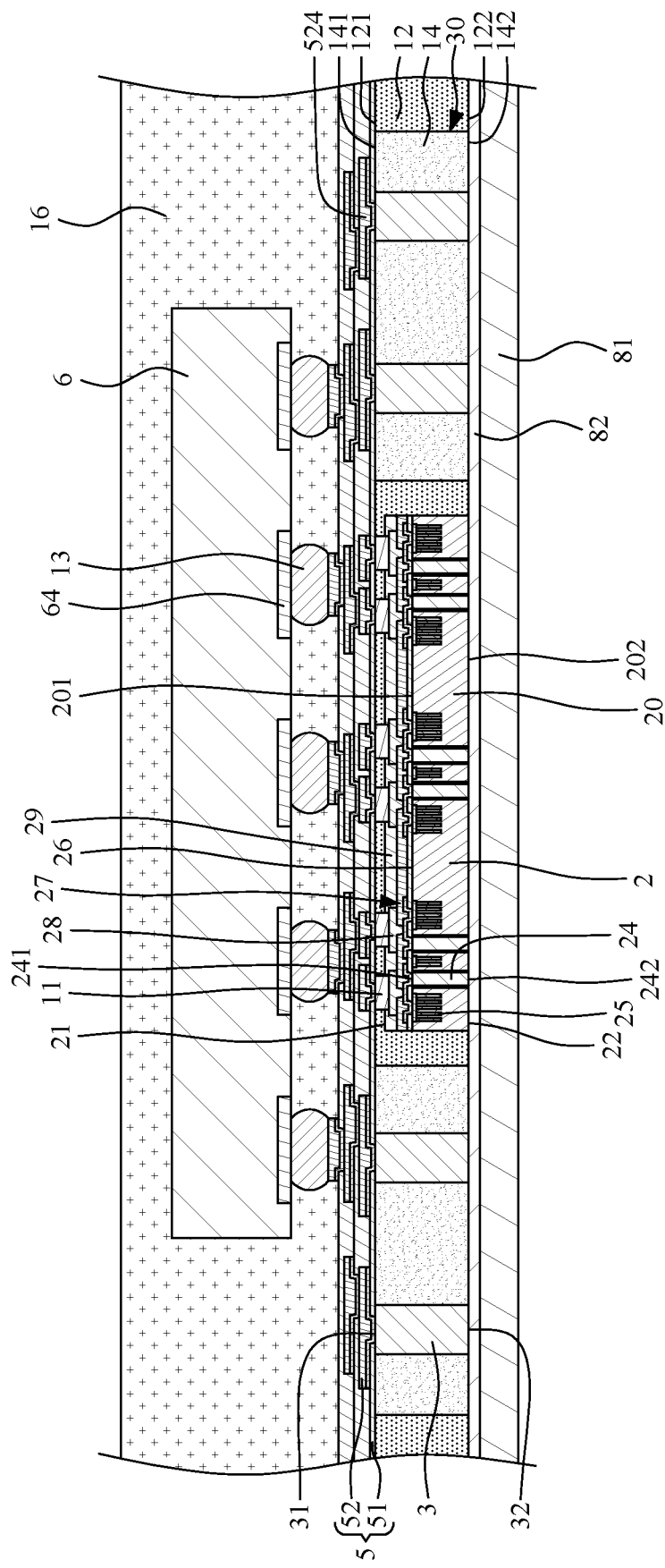
FIG. 18 illustrates one or more stages of an example of a method for manufacturing a semiconductor package structure according to some embodiments of the present disclosure.

Referring to FIG. 18, a second redistribution structure 5 is formed on the first encapsulant 12. The second redistribution structure 5 may include a dielectric layer 51 and a redistribution layer 52. The redistribution layer 52 is configured to electrically connect the short pillar 11 of the first electronic component 2 and the second surface 31 of the conductive element 3. Then, a second electronic component 6 may be disposed on and is configured to electrically connect the second redistribution structure 5. For example, a bump pad 64 of the second electronic component 6 may be electrically connected to the second redistribution structure 5 through a solder material 13. Then, a package body 16 is formed on the second redistribution structure 5 to cover the second electronic component 6.

Figure 19:
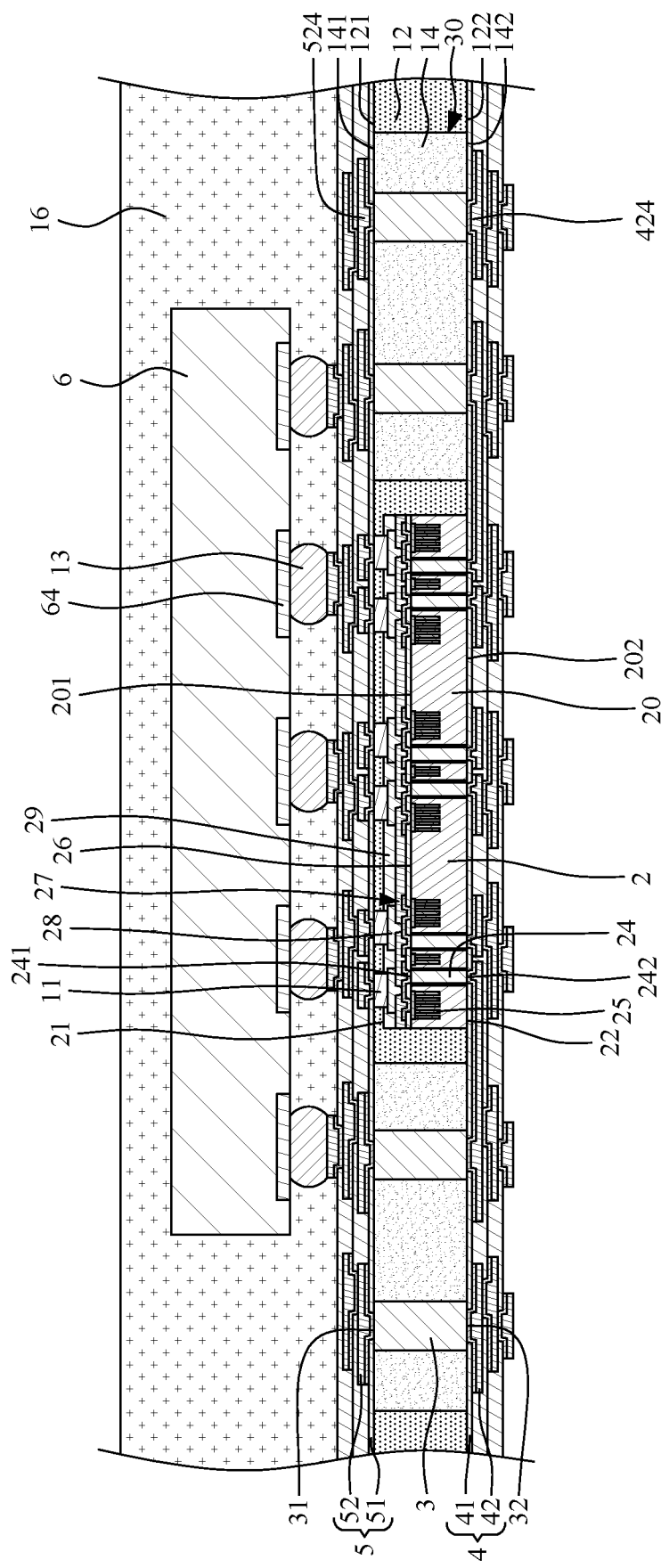
FIG. 19 illustrates one or more stages of an example of a method for manufacturing a semiconductor package structure according to some embodiments of the present disclosure.

Referring to FIG. 19, the carrier 81 and the release layer 82 are then removed to expose the first surface 242 of the first conductive via 24 of the first electronic component 24 and the first surface 32 of the conductive element 3. Then, a first redistribution structure 4 is formed on the second surface 122 of the first encapsulant 12 to electrically connect the first surface 242 of the first conductive via 24 of the first electronic component 2 and the first surface 32 of the conductive element 3. Then, an external connector 15 is disposed on and is configured to electrically connect the lower redistribution 4. A singulation process may then be conducted to the package body 16, the second redistribution structure 5, the first encapsulant 12 and the first redistribution structure 4, thus forming the semiconductor package structure 1 as shown in FIGS. 1 and 2.

Figure 20:
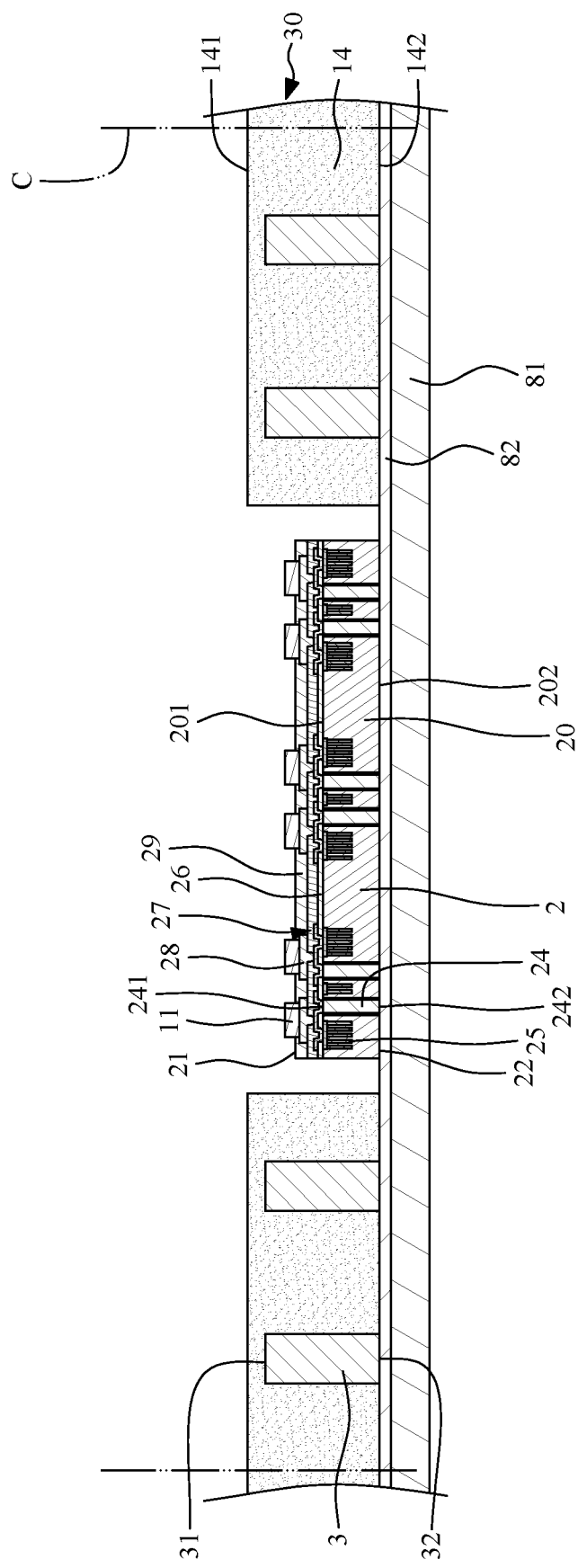
FIG. 20 illustrates a cross sectional view of a semiconductor package structure according to some embodiments of the present disclosure.
Figure 21:
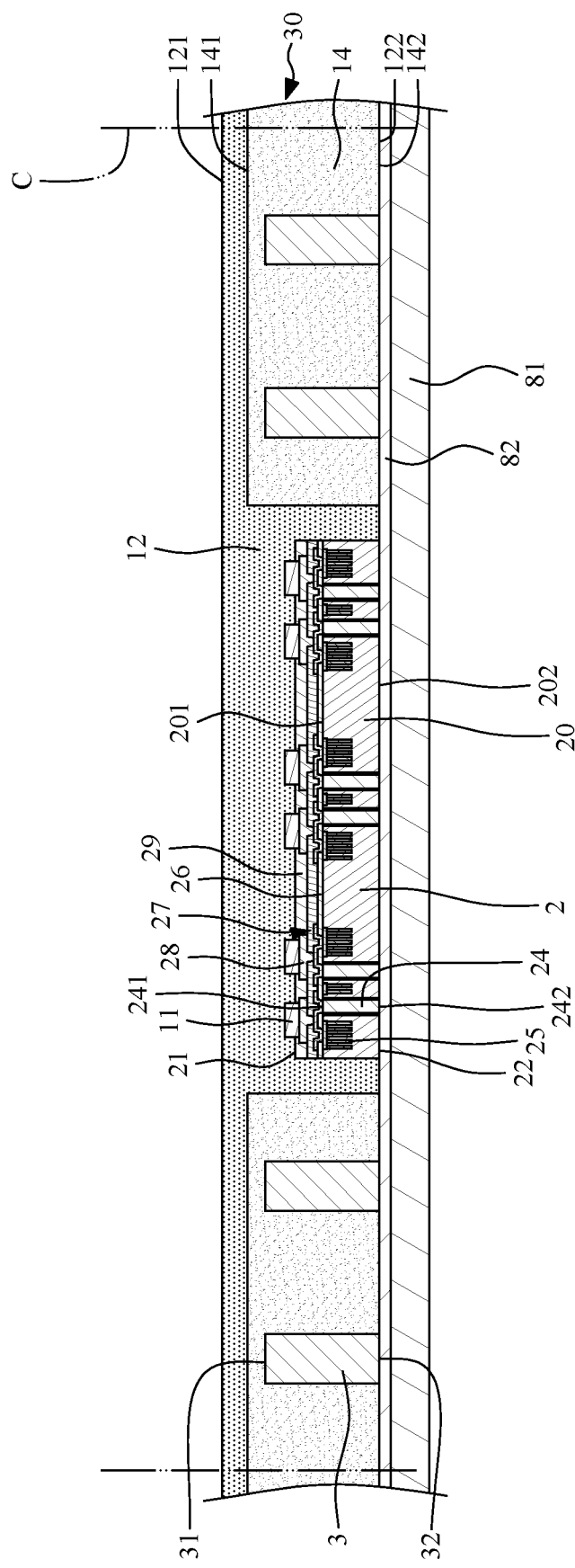
FIG. 21 illustrates one or more stages of an example of a method for manufacturing a semiconductor package structure according to some embodiments of the present disclosure.

FIGS. 20 and 21 illustrate a method for manufacturing a semiconductor package structure according to some embodiments of the present disclosure. In some embodiments, the method is for manufacturing the semiconductor package structure 1a shown in FIG. 5. The initial stages of the illustrated process are the same as, or similar to, the stages illustrated in FIG. 12 through FIG. 14. FIG. 20 depicts a stage subsequent to that depicted in FIG. 14.

Referring to FIG. 20, the first electronic component 2 and a conductive component 30 (including a second encapsulant 14 and at least one conductive element 3) are disposed on a carrier 81, which is similar to the stage illustrated in FIG. 15. However, the conductive component 30 crosses a predetermined boundary (the imaginary line "C") of the semiconductor package structure 1a. FIG. 20A illustrates an arrangement of conductive components in the semiconductor package structure shown in FIG. 20. As shown in FIG. 20A, a single conductive component 30 may provide the conductive elements 3 for two adjacent semiconductor package structures 1a. That is, the second encapsulant 14 crosses the predetermined boundary (the imaginary line "C") of the semiconductor package structure 1a.

Referring to FIG. 21 a first encapsulant 12 is formed on the carrier 81 to cover the first electronic component 2 and the conductive component 30 (including the encapsulant 14 and the conductive element 3). The stages subsequent to that shown in FIG. 21 of the illustrated process are similar to the stages illustrated in FIG. 17 through FIG. 19. Then, a singulation process is conducted to cut along the imaginary line "C" through the second encapsulant 14, thus forming the semiconductor package structure 1a shown in FIG. 5.

Figure 22:
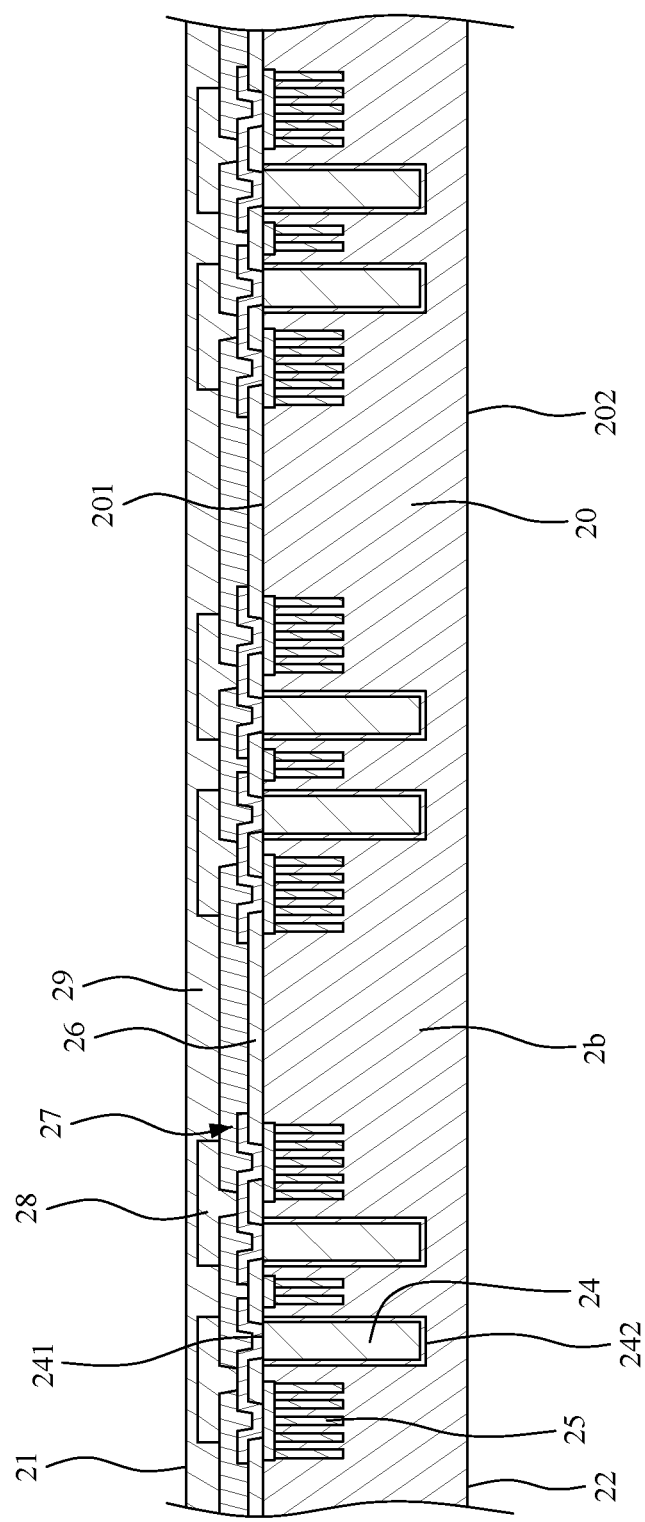
FIG. 22 illustrates one or more stages of an example of a method for manufacturing a semiconductor package structure according to some embodiments of the present disclosure.

FIG. 22 through FIG. 29 illustrate a method for manufacturing a semiconductor package structure according to some embodiments of the present disclosure. In some embodiments, the method is for manufacturing the semiconductor package structure 1a shown in FIG. 6. The initial stages of the illustrated process are the same as, or similar to, the stage illustrated in FIG. 12. FIG. 22 depicts a stage subsequent to that depicted in FIG. 12.

Referring to FIG. 22, a portion of the main body 20 of the first electronic component 2a is removed to form a first electronic component 2b with a reduced thickness, which is similar to the stage illustrated in FIG. 13. However, the first surface 242 of the first conductive via 24 is not exposed from the main body 20 of the first electronic component 2b. That is, the thickness of the first electronic component 2b shown in FIG. 22 is greater than the thickness of the first electronic component 2a shown in FIG. 13. Such a greater thickness provides the first electronic component 2b with a better rigidity.

Figure 23:
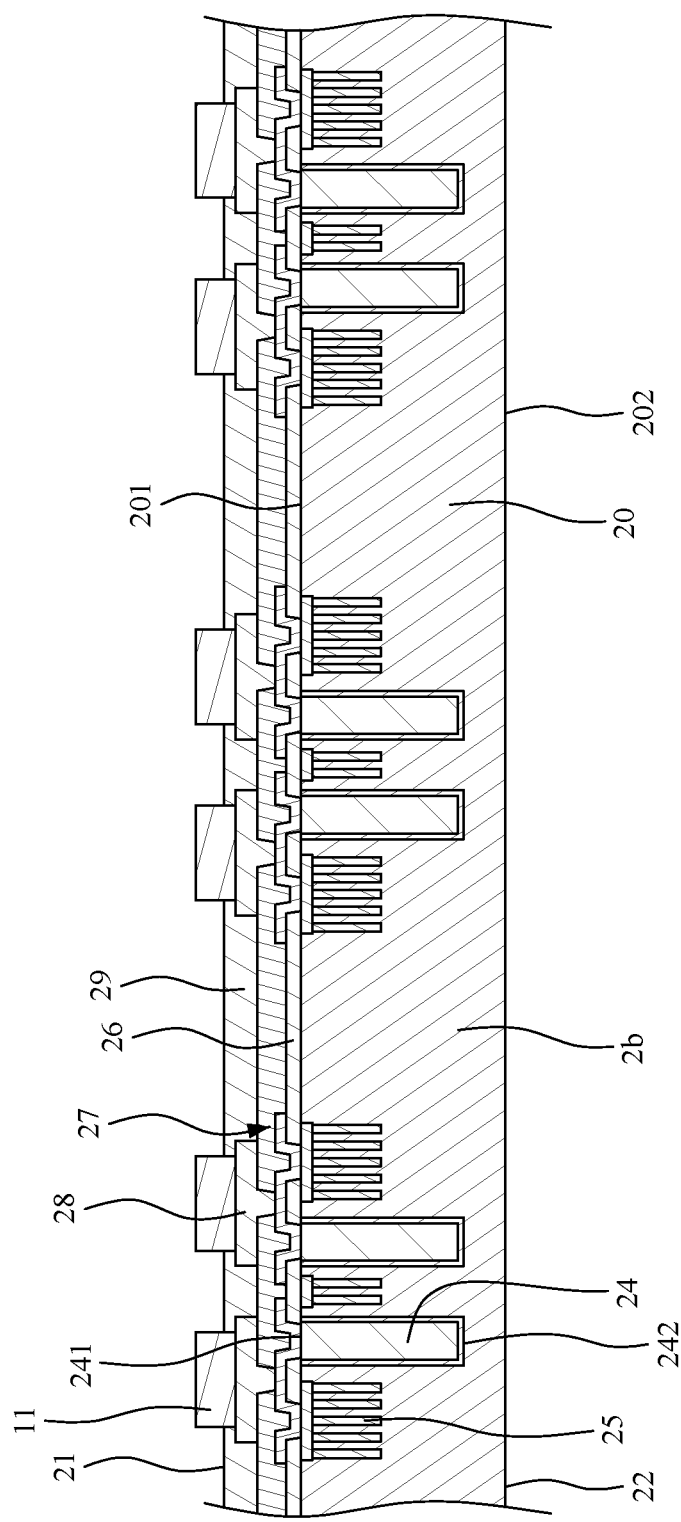
FIG. 23 illustrates one or more stages of an example of a method for manufacturing a semiconductor package structure according to some embodiments of the present disclosure.

Referring to FIG. 23, a short pillar 11 is formed extending through the second dielectric layer 29 and contacting the conductive pad 28, which is similar to the stage illustrated in FIG. 14. Then, the wafer containing the first electronic components 2b may be singulated into each of the first electronic component 2b. As discussed above, due to the greater thickness, the first electronic component 2b is provided with a better rigidity, which is advantageous for a following pick and place process.

Figure 24:
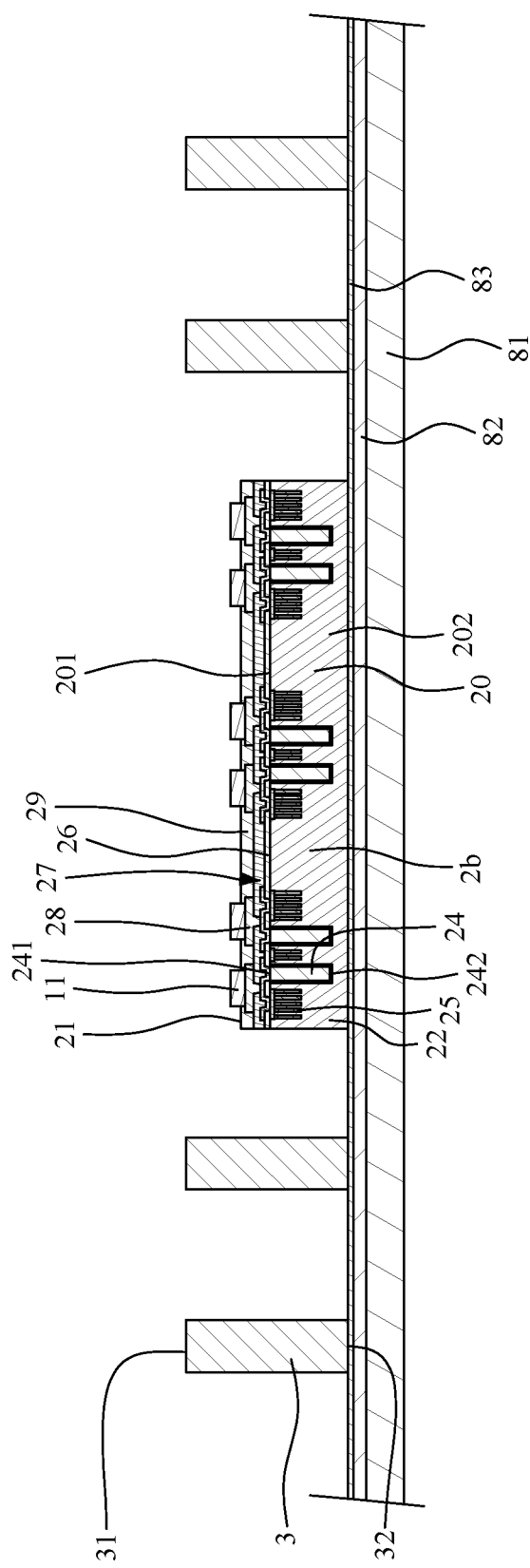
FIG. 24 illustrates one or more stages of an example of a method for manufacturing a semiconductor package structure according to some embodiments of the present disclosure.

Referring to FIG. 24, a carrier 81 and a release layer 82 disposed thereon are provided. A seed layer 83 is then formed on the carrier layer 82 by, for example, sputtering. Then, at least one conductive element 3 is formed on the seed layer 83 by, for example, plating. The conductive element 3 has a second surface 31 and a second surface 32 opposite to the first surface 31. The second surface 32 contacts the seed layer. The first electronic component 2b is then disposed on the seed layer 83, with the first surface 22 contacting the seed layer 83. Since the first surface 242 of the first conductive via 24 is not exposed from the first surface 22 of the first electronic component 2b, the first surface 242 of the first conductive via 24 of the first electronic component 2 is not coplanar with the first surface 32 of the conductive element 3.

Figure 25:
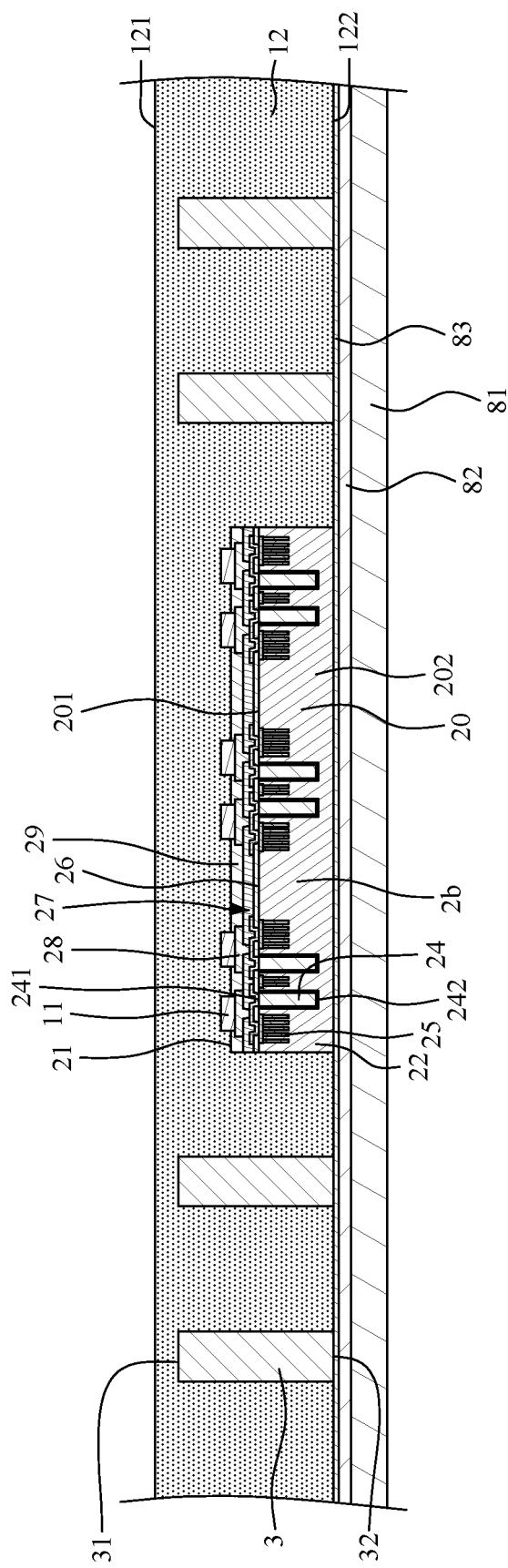
FIG. 25 illustrates one or more stages of an example of a method for manufacturing a semiconductor package structure according to some embodiments of the present disclosure.

Referring to FIG. 25, a first encapsulant 12 is formed on the carrier 81 to cover the first electronic component 2b and the conductive element 3. The first encapsulant 12 has a first surface 121 and a second surface 122 opposite to the first surface 121. The first surface 121 of the first encapsulant 12 may be higher than the second surface 31 of the conductive element 3. The second surface 122 of the first encapsulant 12 contacts the seed layer 83 and is substantially coplanar with the first surface 22 of the first electronic component 2b and the first surface 32 of the conductive element 3.

Figure 26:
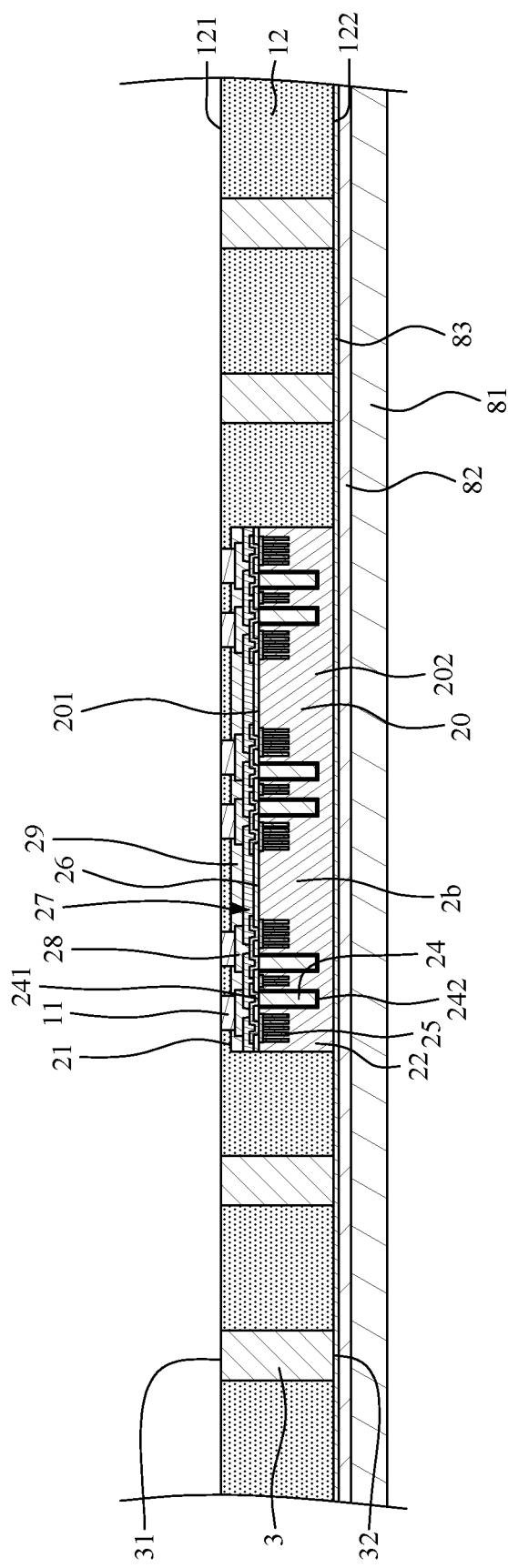
FIG. 26 illustrates one or more stages of an example of a method for manufacturing a semiconductor package structure according to some embodiments of the present disclosure.

Referring to FIG. 26, a grinding process is conducted to remove a portion of the first encapsulant 12, so as to expose the first electronic component 2 and the conductive element 3. A portion of the conductive element 3 may also be removed (i.e., the conductive element 3 may be shortened), such that the second surface 31 of the conductive element 3 may be substantially coplanar with a top surface 111 of the short pillar 11 of the first electronic component 2.

Figure 27:
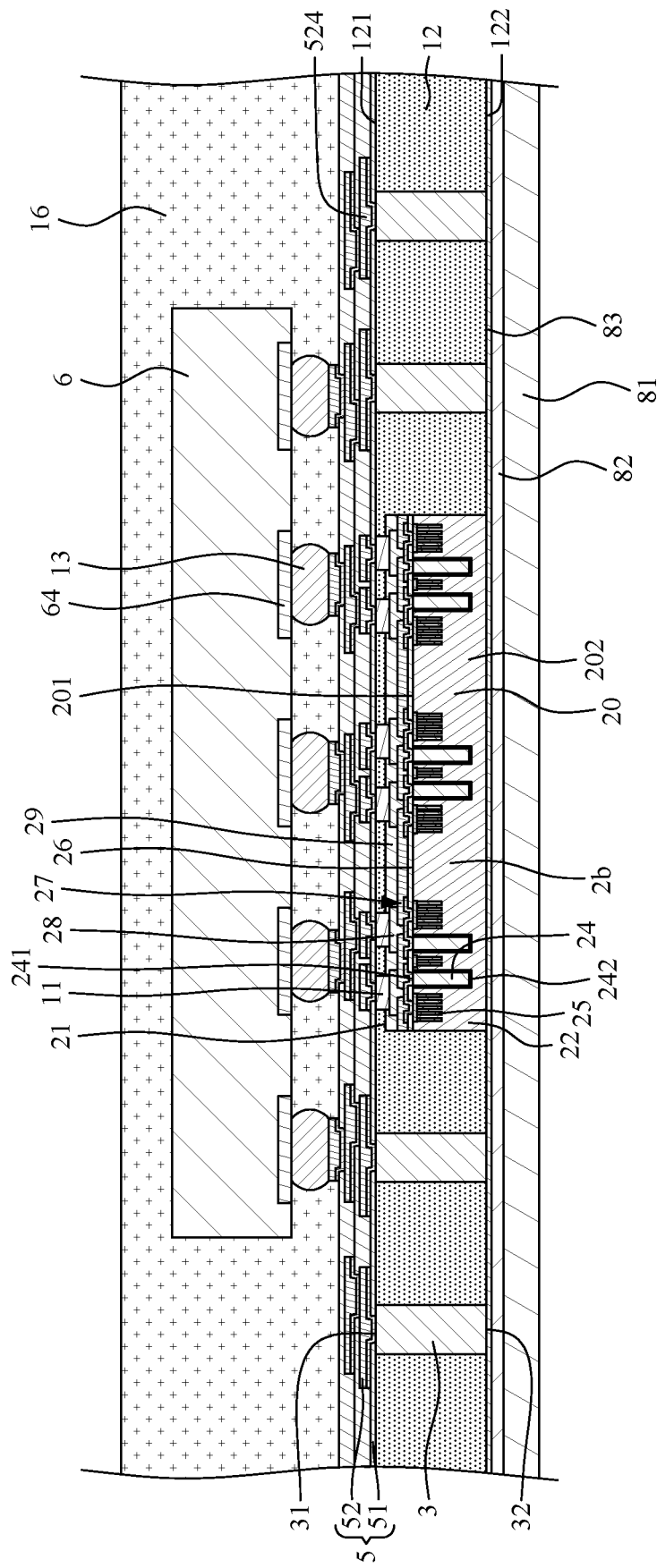
FIG. 27 illustrates one or more stages of an example of a method for manufacturing a semiconductor package structure according to some embodiments of the present disclosure.

Referring to FIG. 27, a second redistribution structure 5 is formed on the first encapsulant 12. The second redistribution structure 5 may include a dielectric layer 51 and a redistribution layer 52. The redistribution layer 52 is configured to electrically connect the short pillar 11 of the first electronic component 2 and the second surface 31 of the conductive element 3. Then, a second electronic component 6 may be disposed on and configure to electrically connect the second redistribution structure 5. For example, a bump pad 64 of the second electronic component 6 may be configured to electrically connect the second redistribution structure 5 through a solder material 13. Then, a package body 16 is formed on the second redistribution structure 5 to cover the second electronic component 6.

Figure 28:
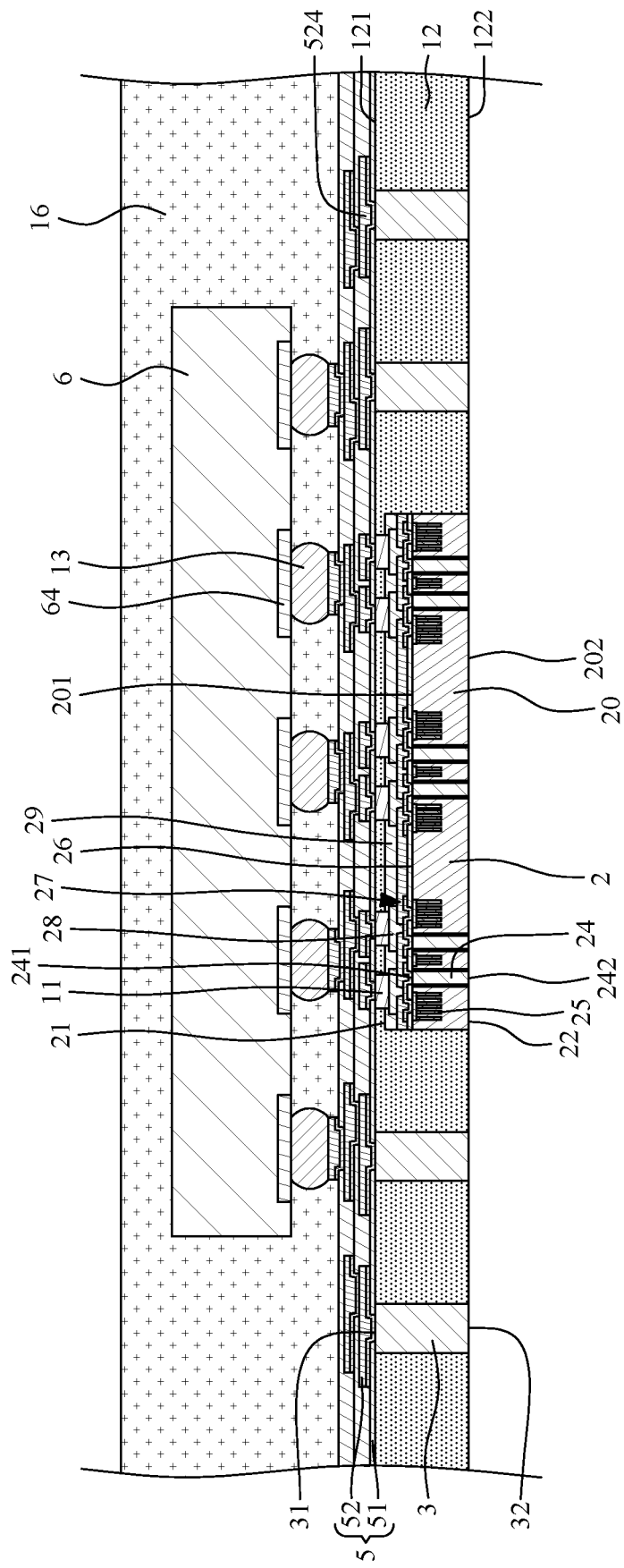
FIG. 28 illustrates one or more stages of an example of a method for manufacturing a semiconductor package structure according to some embodiments of the present disclosure.
Figure 29:
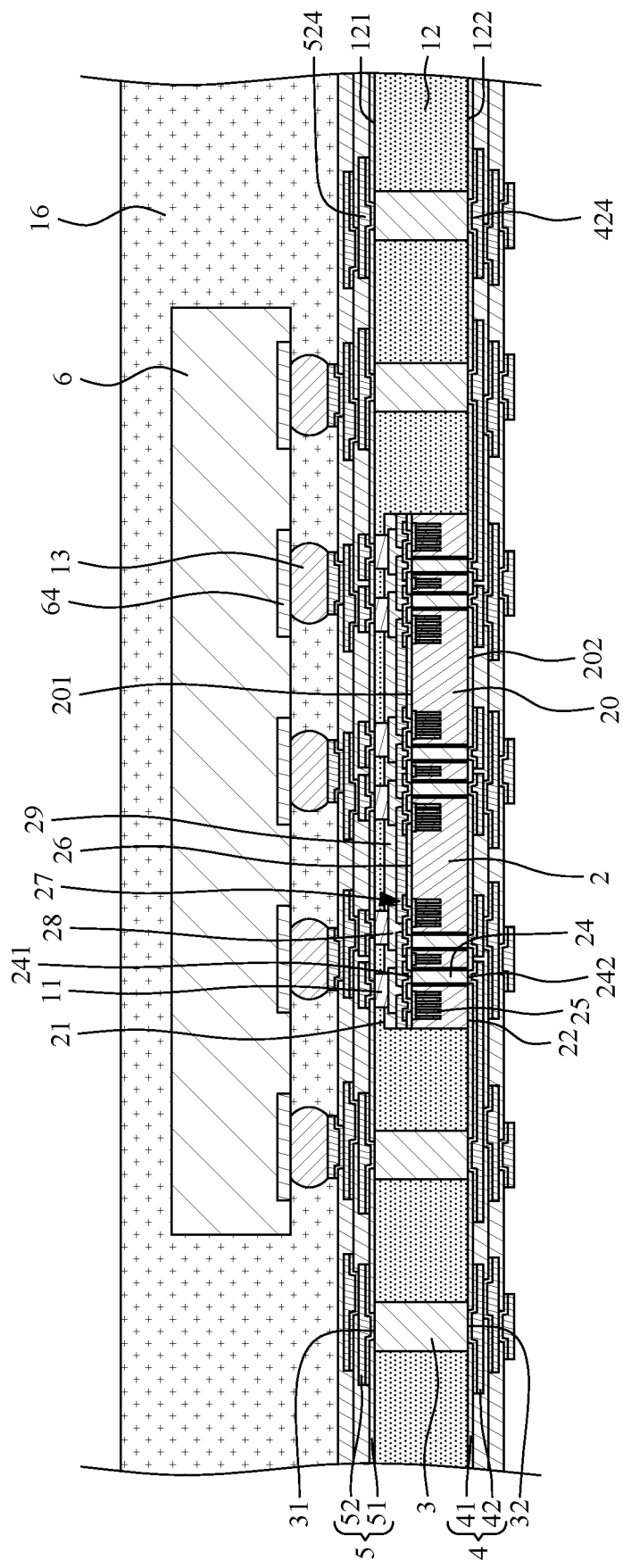
FIG. 29 illustrates one or more stages of an example of a method for manufacturing a semiconductor package structure according to some embodiments of the present disclosure.

Referring to FIG. 28, the carrier 81, the release layer 82, the seed layer 83 and a portion of the first encapsulant 12 are then removed to expose the first electronic component 24 and the first surface 32 of the conductive element 3. A portion of the first electronic component 2b is also removed to expose the first surface 242 of the first conductive via 24, thus forming the first electronic component 2. The release layer 82, the seed layer 83, the portion of the first encapsulant 12 and the portion of the first electronic component 2 may be removed by a grinding process. Besides, a portion of the first conductive via 24 of the first electronic component 2 and/or a portion of the conductive element 3 may also be removed. Hence, the first surface 242 of the first conductive via 24 is substantially coplanar with the first surface 32 of the conductive element 3. Then, a first redistribution structure 4 is formed on the second surface 122 of the first encapsulant 12 to electrically connect the first surface 242 of the first conductive via 24 of the first electronic component 2 and the first surface 32 of the conductive element 3. Then, an external connector 15 is disposed on and configure to electrically connect the lower redistribution 4. A singulation process may then be conducted to the package body 16, the second redistribution structure 5, the first encapsulant 12 and the first redistribution structure 4, thus forming the semiconductor package structure 1b as shown in FIG. 6.

FIG. 30 through FIG. 38 illustrate a method for manufacturing a semiconductor package structure according to some embodiments of the present disclosure. In some embodiments, the method is for manufacturing the semiconductor package structure 1c shown in FIGS. 7 and 8.

Figure 30:
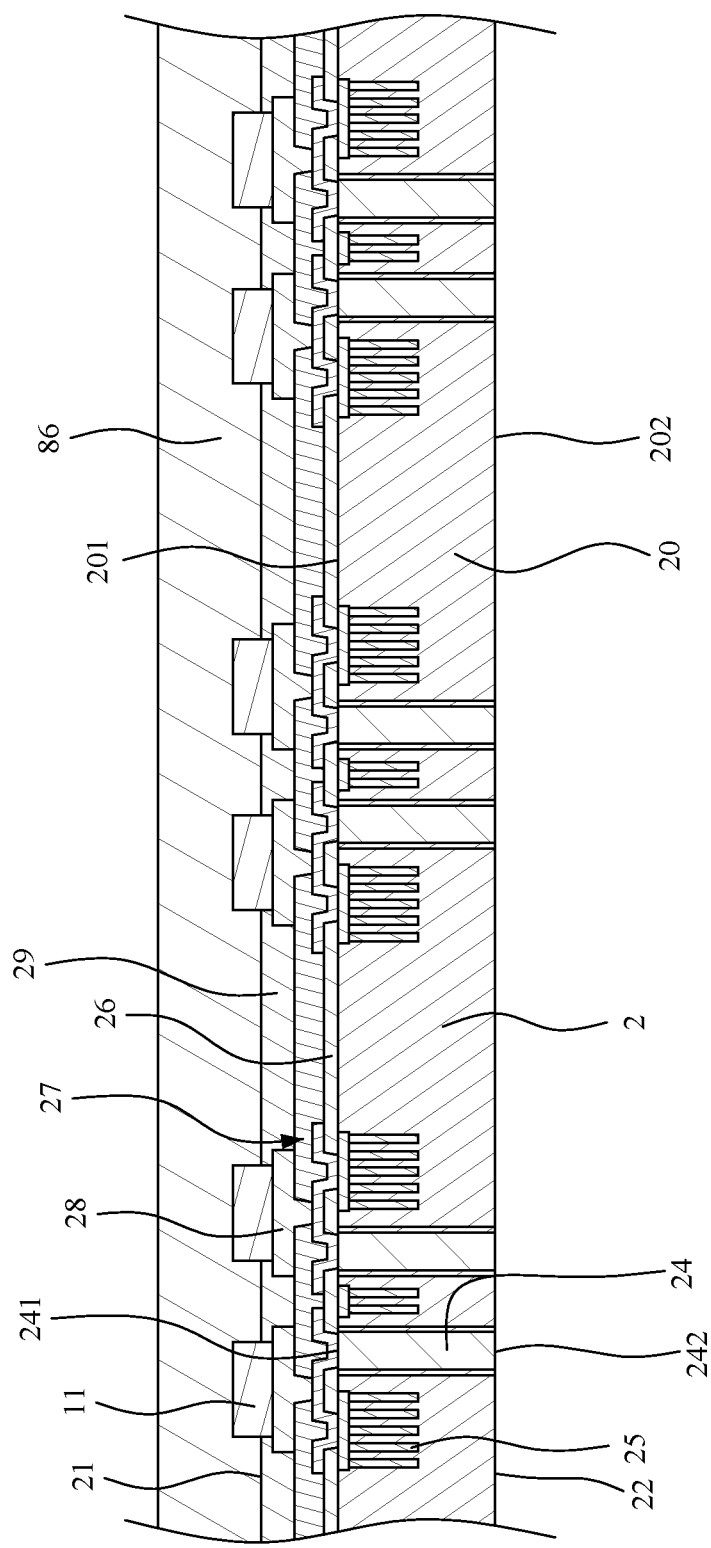
FIG. 30 illustrates a cross sectional view of a semiconductor package structure according to some embodiments of the present disclosure.

The initial stages of the illustrated process are the same as, or similar to, the stages illustrated in FIG. 12 through FIG. 14. FIG. 30 depicts a stage subsequent to that depicted in FIG. 14.

Referring to FIG. 30, after formation of the short pillar 11, the wafer containing the first electronic component 2 is disposed on a carrier 86, with the second surface 21 of the first electronic component 2 faces the carrier 86.

Figure 31:
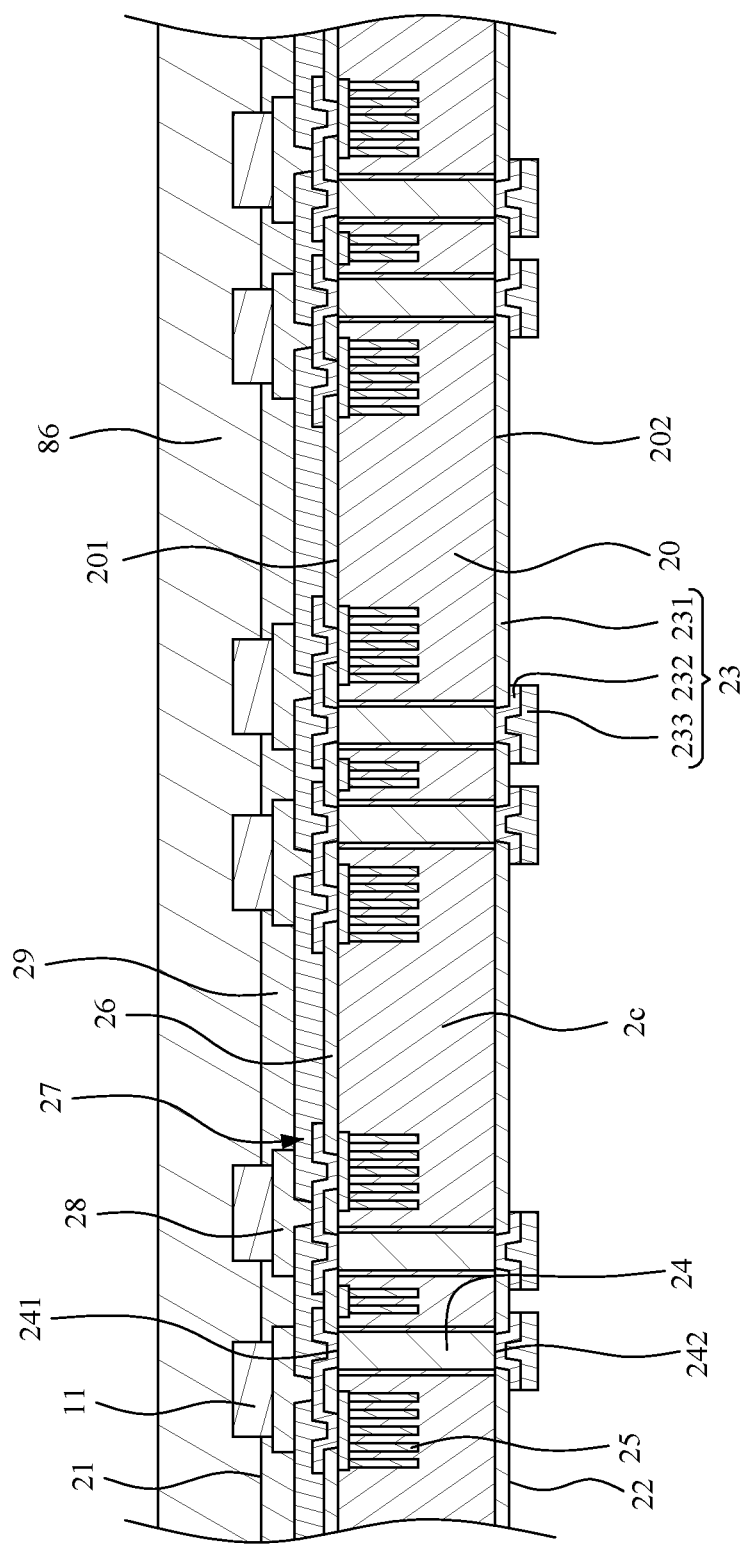
FIG. 31 illustrates one or more stages of an example of a method for manufacturing a semiconductor package structure according to some embodiments of the present disclosure.

Referring to FIG. 31, a conductive structure 23 is formed on the first surface 22 of the first electronic component 2 and configured to electrically connect the first conductive via 24, thus forming a first electronic component 2c. The conductive structure 23 may include a dielectric layer 231, a seed layer 232 and a conductive layer 233. The dielectric layer 231 is disposed on the first surface 22 of the first electronic component 2. The seed layer 232 and the conductive layer 233 are sequentially disposed on the dielectric layer 231, and a portion of the seed layer 232 and the conductive layer 233 extend through the dielectric layer 231 to contact the first surface 242 of the first conductive via 24. The seed layer 232 and the conductive layer 233 may serve as a bump pad for electrical connection.

Figure 32:
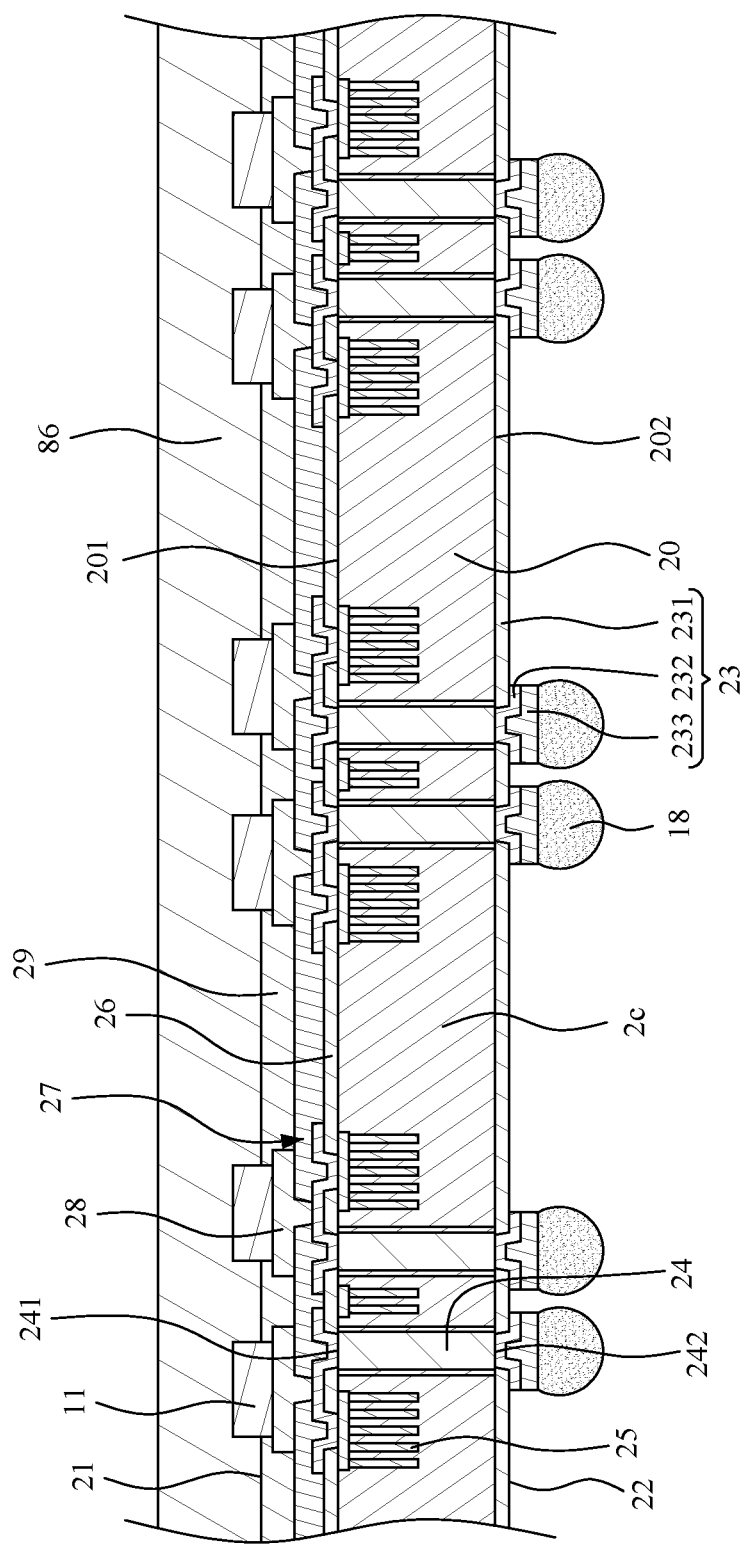
FIG. 32 illustrates one or more stages of an example of a method for manufacturing a semiconductor package structure according to some embodiments of the present disclosure.

Referring to FIG. 32, a solder material 18 is formed or disposed on the conductive structure 23. The solder material 18 may be disposed on the bump pad formed of the seed layer 232 and the conductive layer 233.

Figure 33:
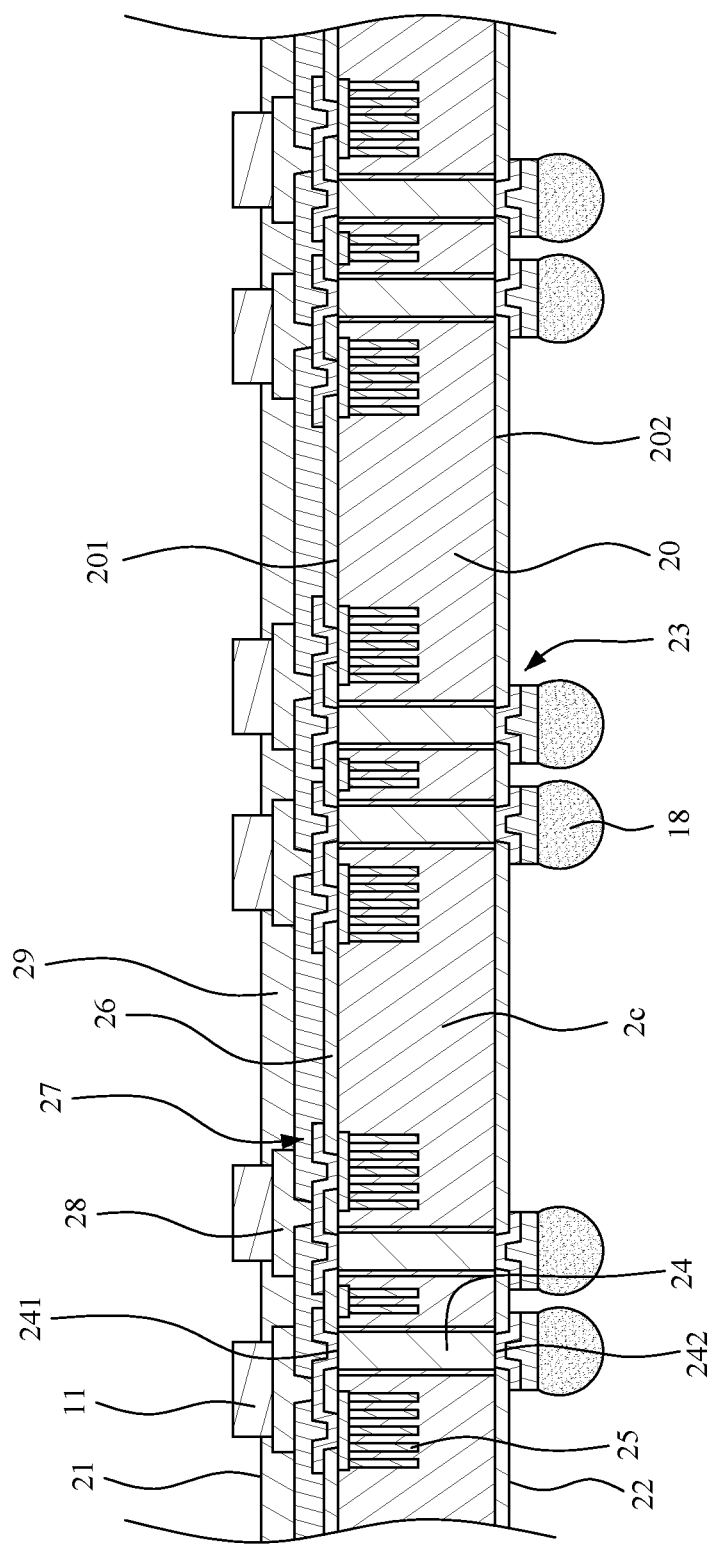
FIG. 33 illustrates one or more stages of an example of a method for manufacturing a semiconductor package structure according to some embodiments of the present disclosure.

Referring to FIG. 33, the carrier 86 is removed. Then, the wafer containing the plurality of the first electronic components 2c may be singulated to form each of the first electronic components 2c as shown in FIGS. 7 and 8.

Figure 34:
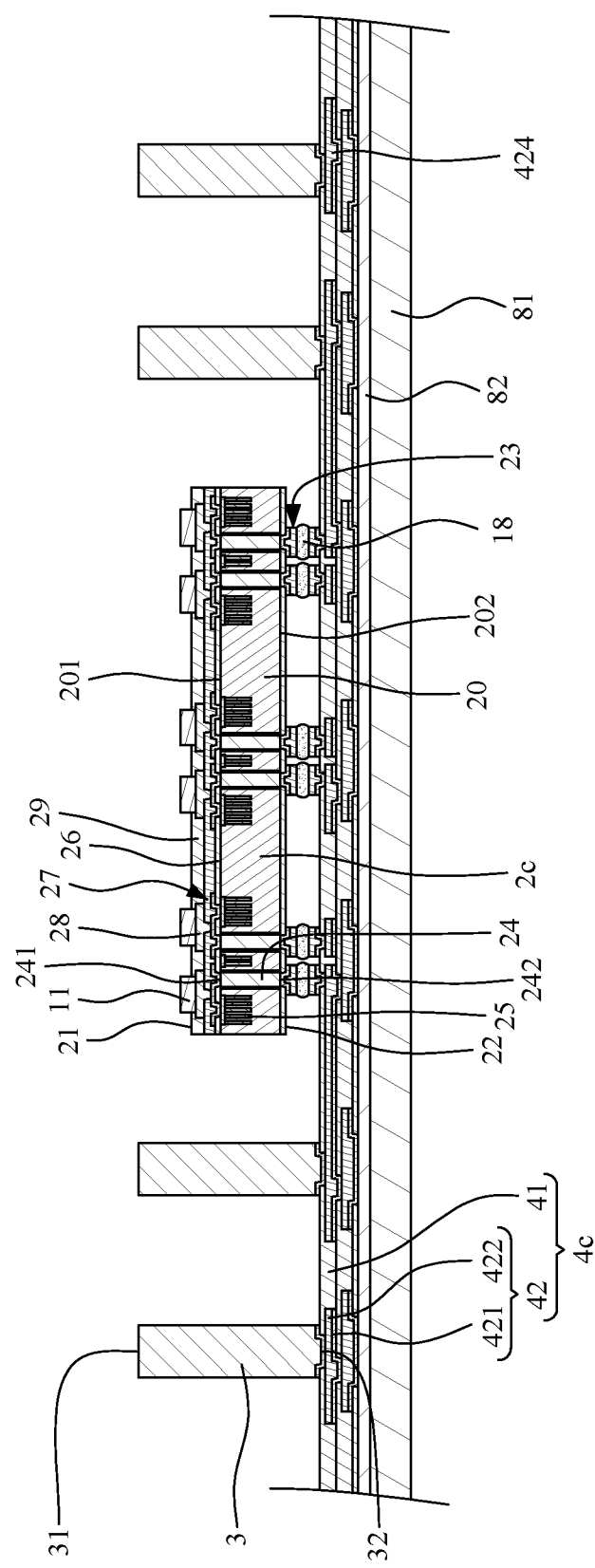
FIG. 34 illustrates one or more stages of an example of a method for manufacturing a semiconductor package structure according to some embodiments of the present disclosure.

Referring to FIG. 34, a carrier 81 and a release layer 82 disposed thereon are provided. A first redistribution structure 4c is formed on the carrier 81. The first redistribution structure 4 includes a dielectric layer 41 and a redistribution layer 42. The redistribution layer 42 may include a seed layer 421 and a conductive layer 422. The redistribution layer 42 of the first redistribution structure 4c may include a second conductive via 424 closer to the first surface 22 of the first electronic component 2 than the second surface 21 of the first electronic component 2. The second conductive via 424 tapers toward the carrier 81.

Then, at least one conductive element 3 is formed on the first redistribution structure 4c by, for example, plating. For example, the conductive element 3 may directly formed on the seed layer 421 of the redistribution layer 41 of the first redistribution structure 4c. The conductive element 3 has a second surface 31 and a first surface 32 opposite to the second surface 31. The first surface 32 directly contacts and is configured to electrically connect the first redistribution structure 4c. Then, the first electronic component 2c is disposed on and configure to electrically connect the first redistribution structure 4c. For example, the first electronic component 2c may be electrically connected to the first redistribution structure 4c through the solder material 18.

Figure 35:
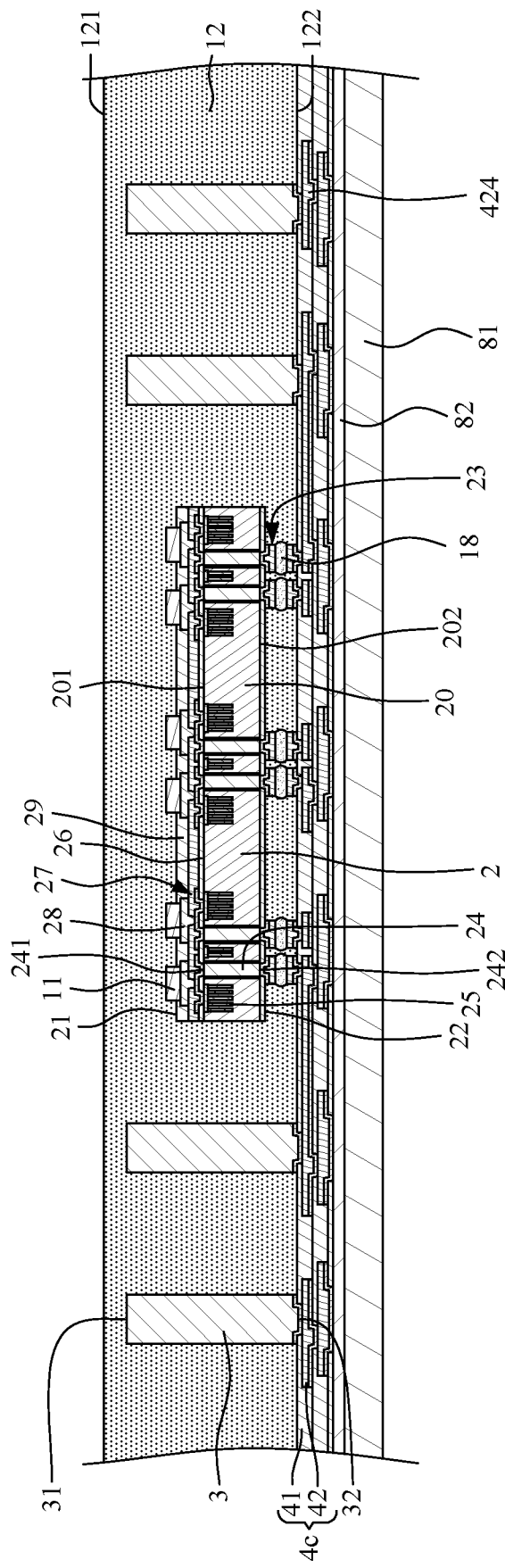
FIG. 35 illustrates one or more stages of an example of a method for manufacturing a semiconductor package structure according to some embodiments of the present disclosure.

Referring to FIG. 35, a first encapsulant 12 is formed on the first redistribution structure 4 to cover the conductive element 3 and the first electronic component 2. A portion of the first encapsulant 12 is interposed between the first electronic component 2c and the first redistribution structure 4. The first encapsulant 12 has a first surface 121 and a second surface 122. The first encapsulant may cover the second surface 31 of the conductive element 3 and the short pillar 11 of the first electronic component 2c. That is, the first surface 121 of the first encapsulant 12 may be higher than the second surface 31 of the conductive element 3 and the short pillar 11 of the first electronic component 2c. The second surface 122 of the first encapsulant 12 contacts the first redistribution structure 4c.

Figure 36:
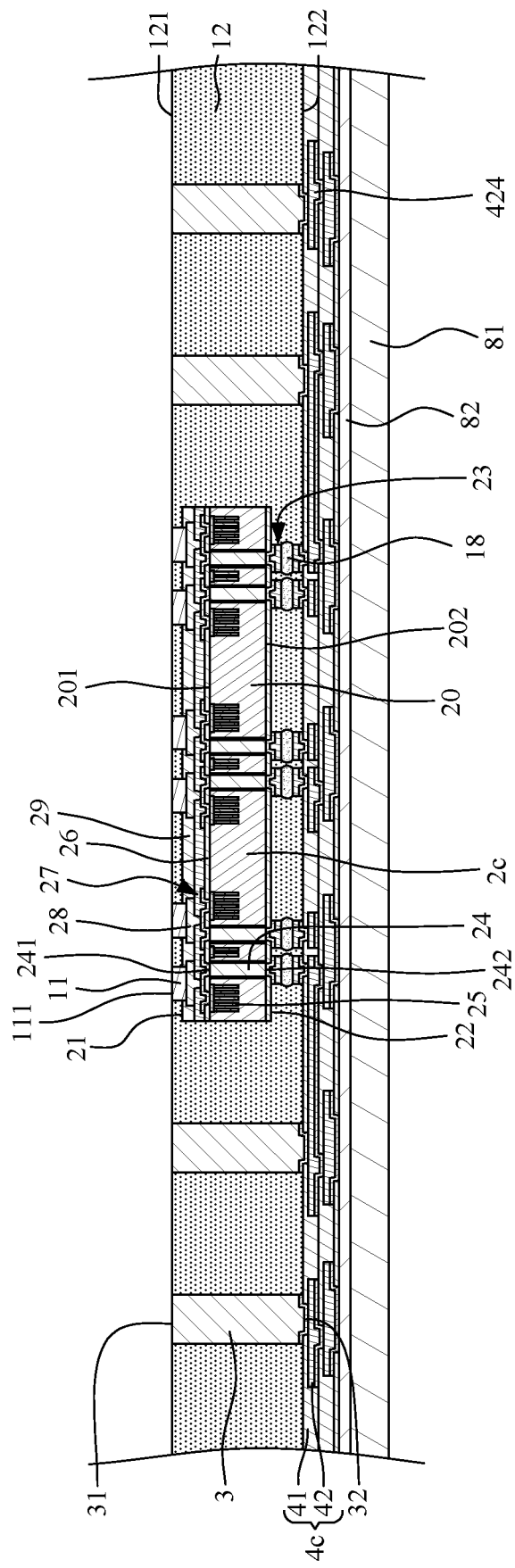
FIG. 36 illustrates one or more stages of an example of a method for manufacturing a semiconductor package structure according to some embodiments of the present disclosure.

Referring to FIG. 36, a grinding process is conducted to remove a portion of the first encapsulant 12, so as to expose the first electronic component 2c and the conductive element 3. A portion of the conductive element 3 may also be removed (i.e., the conductive element 3 may be shortened), such that the second surface 31 of the conductive element 3 may be substantially coplanar with a top surface 111 of the short pillar 11 of the first electronic component 2c. That is, the first surface 121 of the first encapsulant 12 is substantially coplanar with the second surface 31 of the conductive element 3 and the top surface 111 of the short pillar 11 of the first electronic component 2c.

Figure 37:
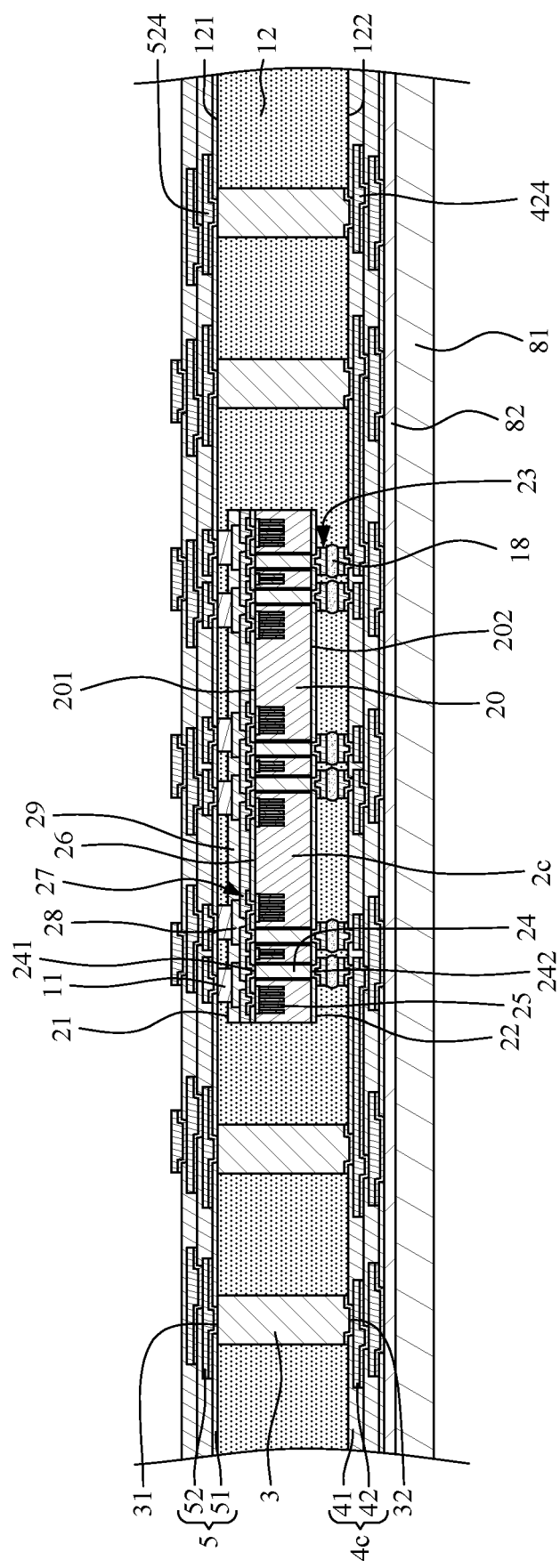
FIG. 37 illustrates one or more stages of an example of a method for manufacturing a semiconductor package structure according to some embodiments of the present disclosure.

Referring to FIG. 37, a second redistribution structure 5 is formed on the first surface 121 of the first encapsulant 12, and is configured to electrically connect the first electronic component 2c and the conductive element 3. The second redistribution structure 5 may include a dielectric layer 51 and a redistribution layer 52. The redistribution layer 52 extends through the dielectric layer 51 to contact the short pillar 11 of the first electronic component 2c and the second surface 31 of the conductive element 3.

Figure 38:
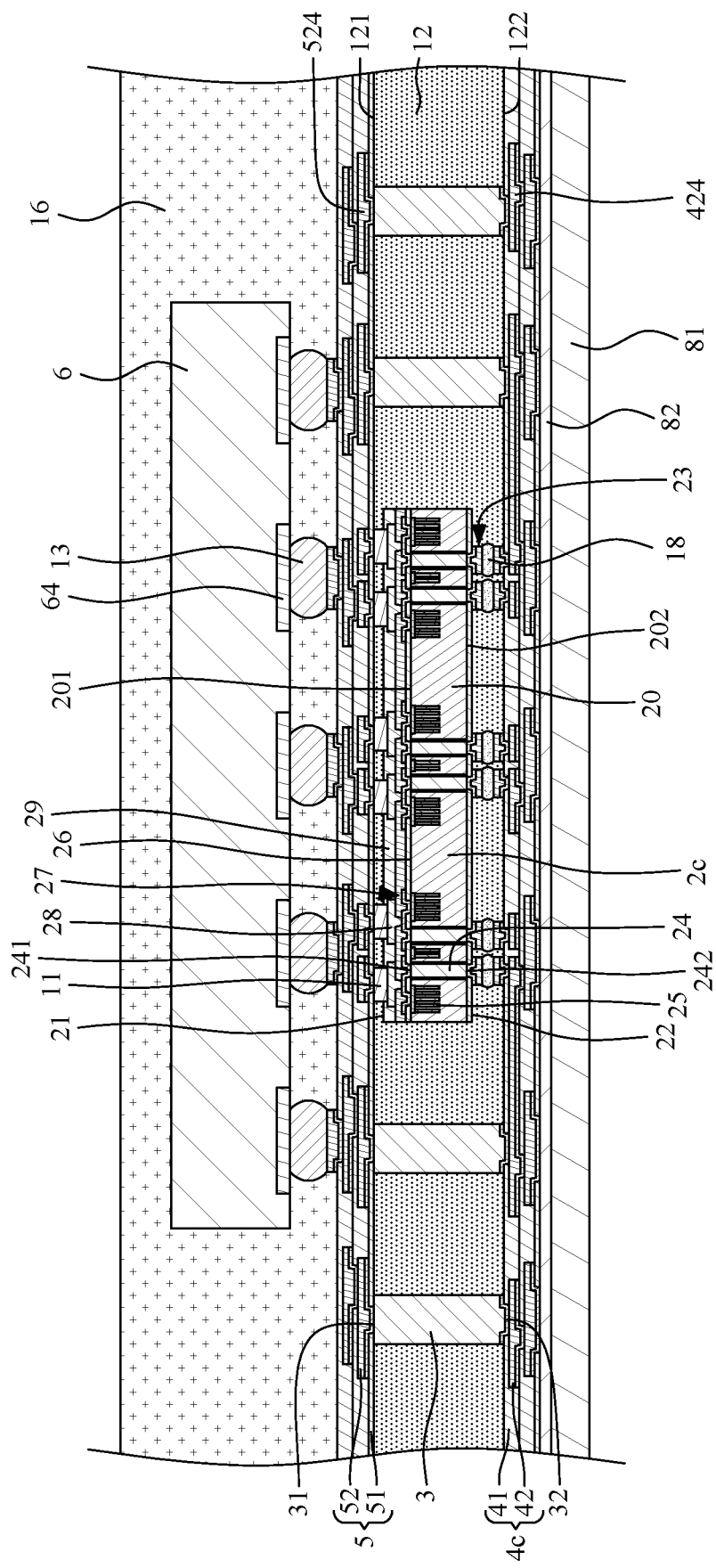
FIG. 38 illustrates one or more stages of an example of a method for manufacturing a semiconductor package structure according to some embodiments of the present disclosure.

Referring to FIG. 38, a second electronic component 6 is disposed on and configure to electrically connect the second redistribution structure 5. For example, a bump pad 64 of the second electronic component 6 may be electrically connected to the second redistribution structure 5 through a solder material 13. Then, a package body 16 is formed on the second redistribution structure 5 to cover the second electronic component 6. Then, the carrier 81 and the release layer 82 are removed to expose the first redistribution structure 4c. An external connector 15 is disposed on and configure to electrically connect the first redistribution structure 4c. A singulation process may then be conducted to the package body 16, the second redistribution structure 5, the first encapsulant 12 and the first redistribution structure 4c, thus forming the semiconductor package structure 1c as shown in FIGS. 7 and 8.

Figure 39:
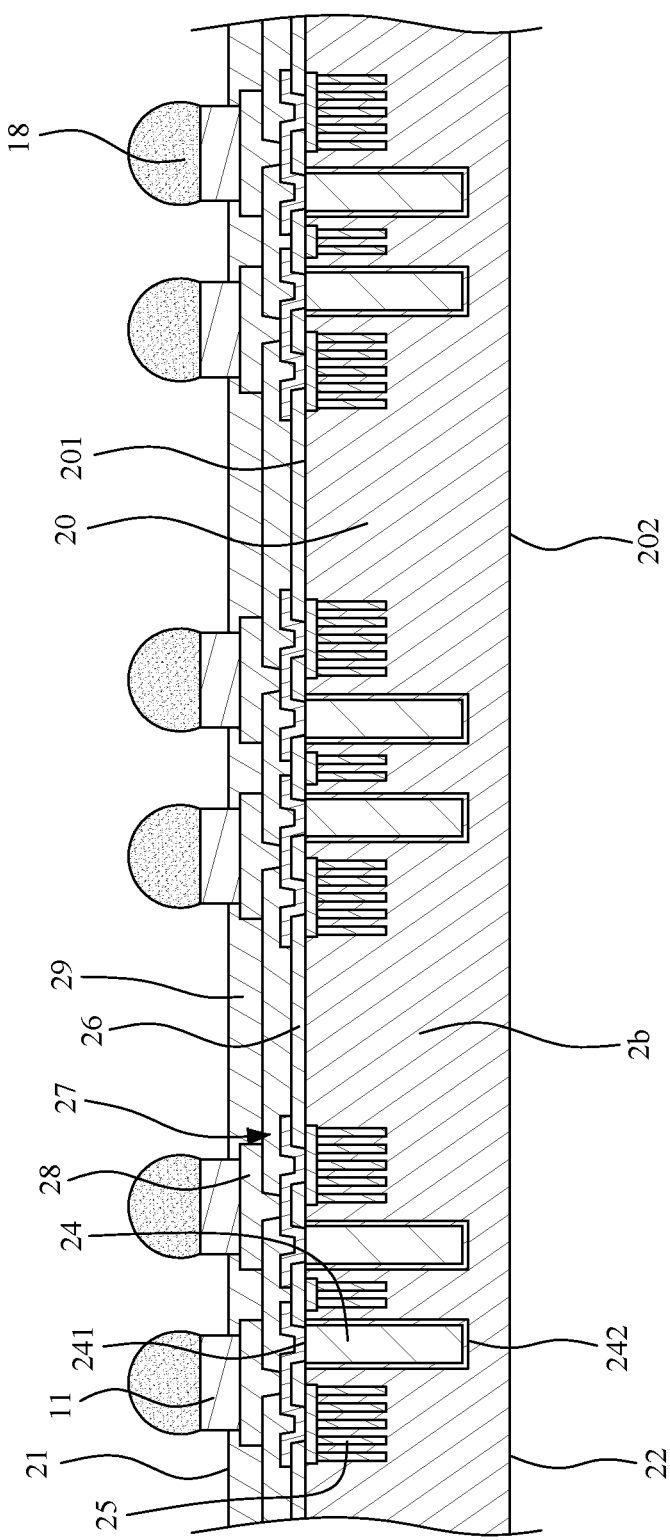
FIG. 39 illustrates one or more stages of an example of a method for manufacturing a semiconductor package structure according to some embodiments of the present disclosure.

FIG. 39 through FIG. 43 illustrate a method for manufacturing a semiconductor package structure according to some embodiments of the present disclosure. In some embodiments, the method is for manufacturing the semiconductor package structure 1d shown in FIG. 9. The initial stages of the illustrated process are the same as, or similar to, the stages illustrated in FIGS. 12, 22 and 23. FIG. 39 depicts a stage subsequent to that depicted in FIG. 23.

Referring to FIG. 39, a solder material 18 is disposed on the short pillar 11 of the first electronic component 2b. Then, the wafer containing the first electronic components 2b may be singulated into each of the first electronic component 2b.

Figure 40:
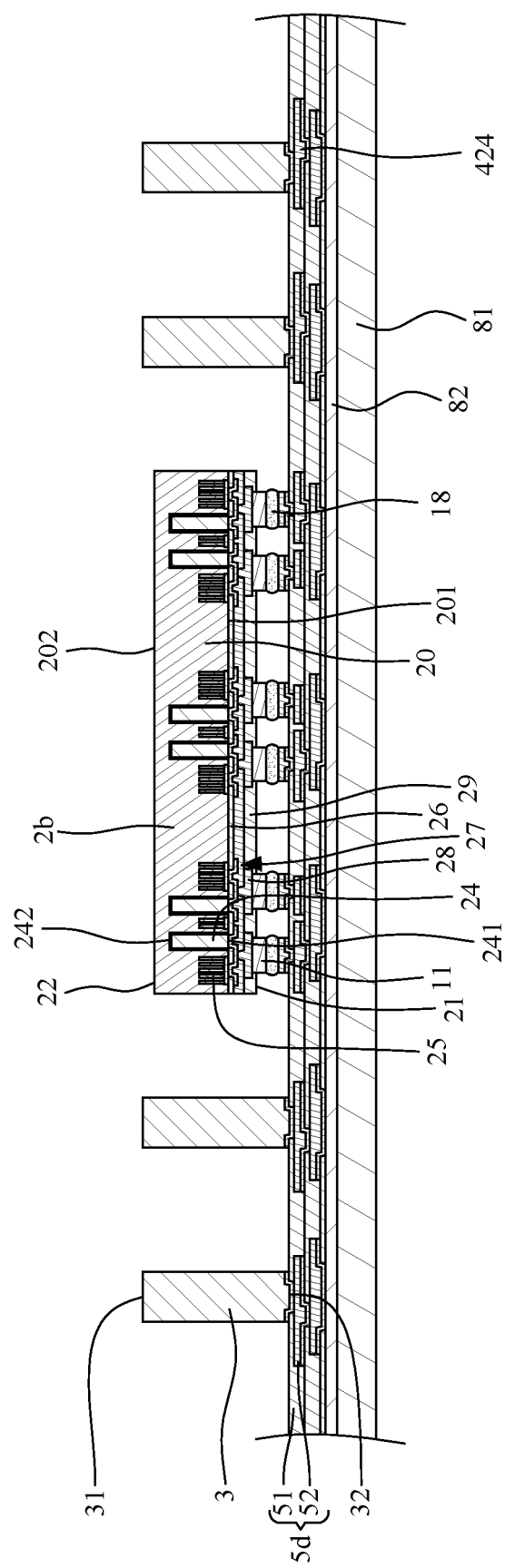
FIG. 40 illustrates a cross sectional view of a semiconductor package structure according to some embodiments of the present disclosure.

Referring to FIG. 40, a carrier 81 with a release layer 82 disposed thereon are provided. A second redistribution structure 5d and at least one conductive element 3 are sequentially formed on the carrier 81. The second redistribution structure 5d may be similar to the first redistribution structure 4c shown in FIG. 34. Then, the first electronic component 2b is disposed on and configure to electrically connect the second redistribution structure 5d. For example, the short pillar 11 of the first electronic component 2b is electrically connected to the second redistribution structure 5d through the solder material 18.

Figure 41:
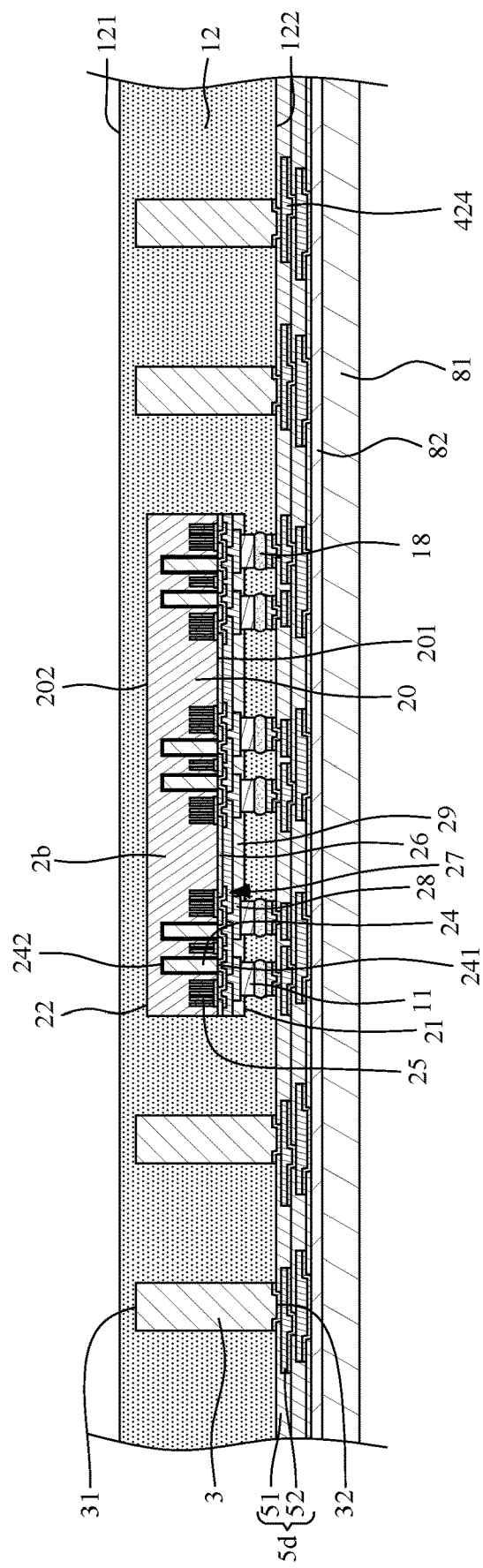
FIG. 41 illustrates one or more stages of an example of a method for manufacturing a semiconductor package structure according to some embodiments of the present disclosure.

Referring to FIG. 41, a first encapsulant 12 is formed on the second redistribution structure 5d to cover the conductive element 3 and the first electronic component 2b. A portion of the first encapsulant 12 is interposed between the first electronic component 2b and the second redistribution structure 5d. The first encapsulant 12 has a first surface 121 and a second surface 122. The first encapsulant 12 may cover the second surface 31 of the conductive element 3 and the first surface 22 of the first electronic component 2b. That is, the first surface 121 of the first encapsulant 12 may be higher than the second surface 31 of the conductive element 3 and the first surface 22 of the first electronic component 2b. The second surface 122 of the first encapsulant 12 contacts the first redistribution structure 4c.

Figure 42:
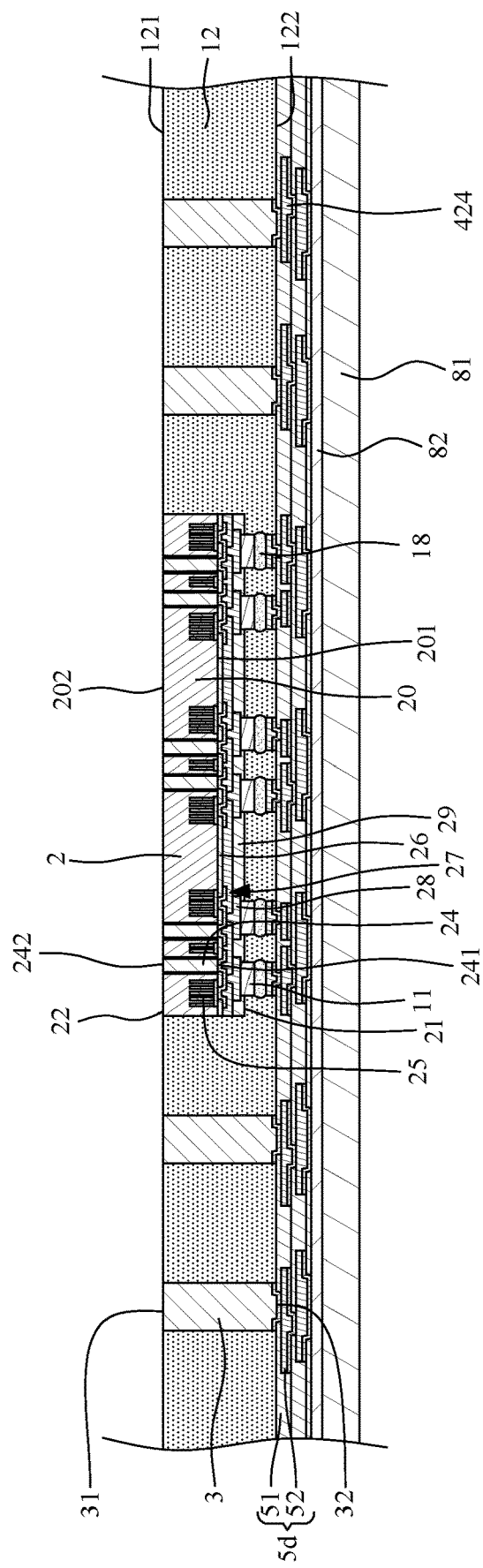
FIG. 42 illustrates one or more stages of an example of a method for manufacturing a semiconductor package structure according to some embodiments of the present disclosure.

Referring to FIG. 42, a portion of the first encapsulant 12 is then removed to expose the first electronic component 24 and the second surface 31 of the conductive element 3. A portion of the first electronic component 2b is also removed to expose the first surface 242 of the first conductive via 24, thus forming the first electronic component 2. The portion of the first encapsulant 12 and the portion of the first electronic component 2b may be removed by a grinding process. Besides, a portion of the first conductive via 24 of the first electronic component 2b and/or a portion of the conductive element 3 may also be removed. Hence, the first surface 242 of the first conductive via 24 is substantially coplanar with the second surface 31 of the conductive element 3.

Figure 43:
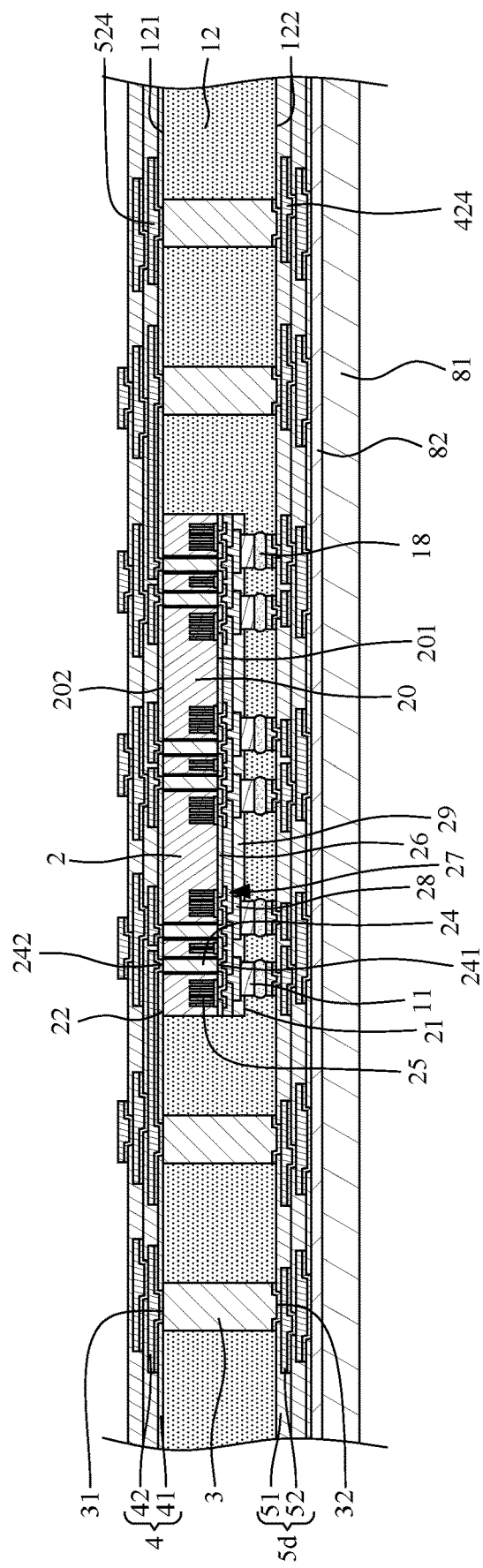
FIG. 43 illustrates one or more stages of an example of a method for manufacturing a semiconductor package structure according to some embodiments of the present disclosure.

Referring to FIG. 43, a first redistribution structure 4 is formed on the first surface 121 of the first encapsulant 12, and is configured to electrically connect the first electronic component 2b and the conductive element 3. The first redistribution structure 4 may include a dielectric layer 41 and a redistribution layer 42. The redistribution layer 42 extends through the dielectric layer 41 to contact the first surface 242 of the first conductive via 24 of the first electronic component 2 and the second surface 31 of the conductive element 3. The stages subsequent to that shown in FIG. 43 of the illustrated process are similar to the stages illustrated in FIG. 38, except that the second electronic component 6 is disposed on and configure to electrically connect the first redistribution structure 4 while the external connecter is disposed on and configure to electrically connect the second redistribution structure 5d. Thus, the semiconductor package structure 1d is formed as shown in FIG. 9.

Figure 44:
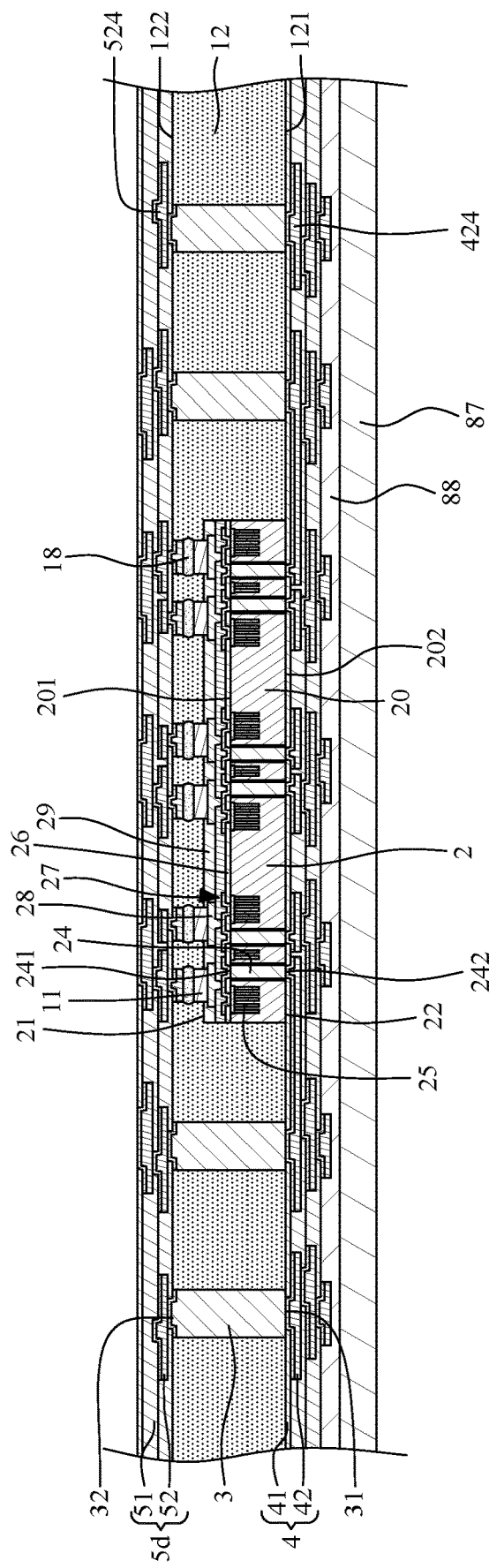
FIG. 44 illustrates one or more stages of an example of a method for manufacturing a semiconductor package structure according to some embodiments of the present disclosure.

FIG. 44 illustrate a method for manufacturing a semiconductor package structure according to some embodiments of the present disclosure. In some embodiments, the method is for manufacturing the semiconductor package structure 1e shown in FIG. 10. The initial stages of the illustrated process are the same as, or similar to, the stages illustrated in FIGS. 12, 22, 23 and 39 through 43. FIG. 44 depicts a stage subsequent to that depicted in FIG. 43.

Referring to FIG. 44, the carrier 81 and the release layer 82 are removed, and the entire structure from the first redistribution structure 4 to the second redistribution structure 5d are disposed on another carrier 87, with the first redistribution structure 5d contacting a release layer 88 disposed on the carrier 87. In other words, the entire structure from the first redistribution structure 4 to the second redistribution structure 5d is disposed on the carrier 87 with a direction opposite to that shown in FIG. 43. The stages subsequent to that shown in FIG. 44 of the illustrated process are similar to the stages illustrated in FIG. 38, thus forming the semiconductor package structure 1e shown in FIG. 10.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first electronic component having a first surface and a second surface opposite to the first surface, and comprising a first conductive via, wherein the first conductive via has a first surface exposed from the first surface of the first electronic component;
   a conductive element disposed adjacent to the first electronic component, wherein the conductive element has a first surface substantially coplanar with the first surface of the first conductive via of the first electronic component, the first redistribution structure comprises a second conductive via closer to the first surface of the first electronic component than the second surface of the first electronic component, and the second conductive via tapers toward the first electronic component and/or the conductive element;
   a first redistribution structure configured to electrically connect the first conductive via of the first electronic component and the conductive element, wherein the first redistribution structure comprises a second conductive via closer to the first surface of the first electronic component than the second surface of the first electronic component, and the second conductive via tapers toward the first electronic component and/or the conductive element;
   a second redistribution structure configured to electrically connect the second surface of the first electronic component and the conductive element, wherein the second redistribution structure comprises a third conductive via closer to the second surface of the first electronic component than the first surface of the first electronic component, and the third conductive via tapers toward the first electronic component and/or the conductive element;
   a first encapsulant encapsulating the first electronic component and the conductive elements, wherein the first redistribution structure is disposed on the first encapsulant; and
   a second encapsulant encapsulating the conductive element, wherein the first encapsulant encapsulates the second encapsulant.

2. The semiconductor package structure of claim 1, wherein the first redistribution structure comprises a redistribution layer contacting the first conductive via of the first electronic component and the conductive element.

3. The semiconductor package structure of claim 1, further comprising a second electronic component disposed on and configured to be electrically connected to the second redistribution structure.

4. The semiconductor package structure of claim 3, further comprising a package body disposed on the second redistribution structure and encapsulating the second electronic component.

5. The semiconductor package structure of claim 3, further comprising a third electronic component disposed on and electrically connected to the second redistribution structure, wherein the first electronic component is configured for signal transmission between the second electronic component and the third electronic component.

6. The semiconductor package structure of claim 1, wherein a surface of the first encapsulant is substantially coplanar with a surface of the second encapsulant.

7. The semiconductor package structure of claim 1, wherein the first electronic component is configured to electrically connect the second redistribution structure through a solder material.

8. The semiconductor package structure of claim 1, wherein the first electronic component comprises a deep trench capacitor configured to be electrically connected to the second electronic component.

9. The semiconductor package structure of claim 8, wherein the deep trench capacitor is closer to the second surface of the first electronic component than the first surface of the first electronic component.

10. A semiconductor package structure, comprising:
- a first electronic component having a first surface and a second surface opposite to the first surface, and comprising a first conductive via exposed from the first surface of the first electronic component;
- a first redistribution structure disposed below the first surface of the first electronic component, wherein the first redistribution structure comprises a second conductive via tapering toward the first electronic component;
- a second redistribution structure disposed above the second surface of the electronic component and configured to electrically connect the first redistribution structure through the first conductive via of the first electronic component, wherein the second redistribution structure comprises a third conductive via tapering toward the first electronic component;
- a conductive element configured to electrically connect the first redistribution structure to the second redistribution structure, wherein the conductive element has a surface substantially coplanar with a surface of the first conductive via of the first electronic component, and the first redistribution structure comprises a redistribution layer contacting the first conductive via of the first electronic component and the conductive element;
- a first encapsulant encapsulating the first electronic component and the conductive element, wherein the first encapsulant has a surface substantially coplanar with the surface of the conductive element; and
- a second encapsulant encapsulating the conductive element, wherein the second encapsulant physically separates the conductive element from the first encapsulant.

11. A semiconductor package structure, comprising:
- a first electronic component having a first surface and a second surface opposite to the first surface, and comprising a first conductive via exposed from the first surface of the first electronic component;
- a first redistribution structure disposed below the first surface of the first electronic component;
- a second redistribution structure disposed above the second surface of the first electronic component; and
- an encapsulant in contact with the first redistribution structure and the second redistribution structure, wherein a portion of the encapsulant is interposed between the first electronic component and the first redistribution structure,
- wherein the first electronic component further comprises a deep trench capacitor configured to be electrically connected to the first redistribution structure or the second redistribution structure.

\* \* \* \* \*